(12) United States Patent
Li et al.

(10) Patent No.: US 11,263,995 B2
(45) Date of Patent: Mar. 1, 2022

(54) DISPLAY DEVICE, ELECTRONIC EQUIPMENT, AND METHOD FOR DRIVING DISPLAY DEVICE

(71) Applicant: BOE TECHNOLOGY GROUP CO., LTD., Beijing (CN)

(72) Inventors: Yangbing Li, Beijing (CN); Pengpeng Wang, Beijing (CN); Xiaoliang Ding, Beijing (CN); Jiabin Wang, Beijing (CN); Yapeng Li, Beijing (CN); Likai Deng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/652,797

(22) PCT Filed: Mar. 21, 2019

(86) PCT No.: PCT/CN2019/079080
§ 371 (c)(1),
(2) Date: Sep. 24, 2020

(87) PCT Pub. No.: WO2020/186519
PCT Pub. Date: Sep. 24, 2020

(65) Prior Publication Data
US 2021/0217379 A1 Jul. 15, 2021

(51) Int. Cl.
*G09G 5/10* (2006.01)
*G02F 1/1333* (2006.01)
(Continued)

(52) U.S. Cl.
CPC ............ *G09G 5/10* (2013.01); *G02F 1/13338* (2013.01); *G09G 2320/064* (2013.01); *H01L 27/3234* (2013.01); *H04N 5/33* (2013.01)

(58) Field of Classification Search
CPC .................. G02F 1/13338; G09G 5/10; G09G 2320/064; G09G 3/36; H04N 5/33; G06T 7/00; H01L 27/3234
See application file for complete search history.

(56) References Cited

U.S. PATENT DOCUMENTS 9,280,951 B2 3/2016 Hasegawa et al.
10,027,898 B2 7/2018 Van Der Tempel et al.
(Continued)

FOREIGN PATENT DOCUMENTS

CN 103959091 A 7/2014
CN 107071382 A 8/2017
(Continued)

OTHER PUBLICATIONS

Office Action and English translation for corresponding Chinese Application No. 201980000359.X, dated Aug. 20, 2021. 16 pages.
(Continued)

*Primary Examiner* — Muhammad N Edun
(74) *Attorney, Agent, or Firm* — Leason Ellis LLP

(57) ABSTRACT

A display device, an electronic equipment, and a method for driving a display device are disclosed. The display device includes a first light source group, a second light source group, a first image sensor group, and a second image sensor group. The first light source group is configured to emit light of a first determined frequency to illuminate a first partial region of a detection object, the second light source group is configured to emit light of a second determined frequency to illuminate a second partial region of the detection object, the first image sensor group is configured to receive the light of the first determined frequency emitted by the first light source group and reflected by the detection object, and the second image sensor group is configured to receive the light (Continued)

of the second determined frequency emitted by the second light source group and reflected by the detection object.

20 Claims, 8 Drawing Sheets

(51) Int. Cl.
*H01L 27/32* (2006.01)
*H04N 5/33* (2006.01)

(56) References Cited

U.S. PATENT DOCUMENTS

| | | | |
|---|---|---|---|
| 2012/0155188 A1* | 6/2012 | Buettner | G11C 7/18 365/189.02 |
| 2013/0321584 A1* | 12/2013 | Choi | H04N 13/254 348/46 |
| 2015/0181099 A1* | 6/2015 | Van Der Tempel | G01S 7/4911 348/135 |
| 2015/0204970 A1 | 7/2015 | Jeong et al. | |
| 2016/0295193 A1 | 10/2016 | Van Nieuwenhove et al. | |

FOREIGN PATENT DOCUMENTS

| | | |
|---|---|---|
| CN | 108921888 A | 11/2018 |
| CN | 109116332 A | 1/2019 |

OTHER PUBLICATIONS

Office Action and English translation for corresponding Indian Application No. 202047022429, dated Nov. 8, 2021. 5 pages.

* cited by examiner

DISPLAY DEVICE, ELECTRONIC EQUIPMENT, AND METHOD FOR DRIVING DISPLAY DEVICE

CROSS-REFERENCE TO RELATED PATENT APPLICATIONS

This application is a U.S. National Stage Application under 35 U.S.C. § 371 of International Patent Application No. PCT/CN2019/079080, filed Mar. 21, 2019, which is incorporated by reference in its entirety.

TECHNICAL FIELD

Embodiments of the present disclosure relate to a display device, an electronic equipment, and a method for driving a display device.

BACKGROUND

In recent years, with development of science technologies, the Internet of Things in which all things are interconnected has become a research focus. In the composition system of the Internet of Things, data required for implementing the interconnection of all things undoubtedly need to be acquired through various sensors, and therefore, there are more and more demands for sensors which are low-cost, highly integrated, and easy-to-use. The wide application of mobile electronic equipment, e.g., popularity of mobile phones, has brought the modern society into a nationwide screen reading era. The display screen is integrated with various sensors and serves as both the output terminal and input terminal of information, which has gradually become the mainstream form of next-generation technology products. Therefore, the integration of various sensors with display screens has become an important direction of technology development. With development of three dimensions (3D) technology, the technology application in aspects, such as stereoscopic display, machine vision, satellite remote sensing, etc., increasingly needs to obtain depth image information of the scene. For example, a depth camera can acquire depth image information of a detection object in the visual field of the camera.

SUMMARY

At least one embodiment of the present disclosure provides a display device, and the display device includes a plurality of light source groups and a plurality of image sensor groups; the plurality of light source groups include a first light source group and a second light source group, and the plurality of image sensor groups include a first image sensor group and a second image sensor group; the first image sensor group corresponds to the first light source group, and the second image sensor group corresponds to the second light source group; the first light source group is configured to emit light of a first determined frequency to a display side of the display device to illuminate a first partial region of a detection object, the second light source group is configured to emit light of a second determined frequency to the display side of the display device to illuminate a second partial region of the detection object, and the first determined frequency is different from the second determined frequency; and the first image sensor group is configured to receive the light of the first determined frequency emitted by the first light source group and reflected by the detection object, and the second image sensor group is configured to receive the light of the second determined frequency emitted by the second light source group and reflected by the detection object.

For example, in the display device provided by at least one embodiment of the present disclosure, the first light source group is separated from the second light source group, the first image sensor group is separated from the second image sensor group, the first light source group is adjacent to the first image sensor group, and the second light source group is adjacent to the second image sensor group.

For example, the display device provided by at least one embodiment of the present disclosure further includes a plurality of light-emitting control units, and the plurality of light-emitting control units include a first light-emitting control unit and a second light-emitting control unit; the first light-emitting control unit is in signal connection with the first light source group, and the first light-emitting control unit is configured to provide a first driving signal to allow the first light source group to emit the light of the first determined frequency; and the second light-emitting control unit is in signal connection with the second light source group, the second light-emitting control unit is configured to provide a second driving signal to allow the second light source group to emit the light of the second determined frequency, and the first driving signal is different from the second driving signal.

For example, the display device provided by at least one embodiment of the present disclosure further includes a display panel, and the display panel includes a plurality of pixel units arranged in an array; each of the plurality of light source groups includes one light source, and each of the plurality of image sensor groups includes one image sensor; and each of the pixel units corresponds to one light source and one image sensor, and the light source and the image sensor are within a spacing between two adjacent pixel units.

For example, in the display device provided by at least one embodiment of the present disclosure, the display panel includes a first substrate away from the display side, a plurality of image sensors and a plurality of light sources are at a plurality of independent positions on a surface, away from the display side, of the first substrate, respectively, and the first substrate is provided with a plurality of first openings corresponding to the plurality of image sensors and a plurality of second openings corresponding to the plurality of light sources in a direction perpendicular to the surface of the first substrate.

For example, in the display device provided by at least one embodiment of the present disclosure, the display panel is an organic light-emitting diode display panel.

For example, the display device provided by at least one embodiment of the present disclosure further includes a backlight module, the backlight module is on a side, away from the display side, of the display panel, a plurality of image sensors and a plurality of light sources are at a plurality of independent positions on a surface, away from the display side, of a back plate of the backlight module, respectively, and the back plate is provided with a plurality of third openings corresponding to the plurality of image sensors and a plurality of fourth openings corresponding to the plurality of light sources in a direction perpendicular to the surface of the backlight module.

For example, in the display device provided by at least one embodiment of the present disclosure, the display panel includes a liquid crystal display panel.

For example, in the display device provided by at least one embodiment of the present disclosure, the light source includes an infrared light source, and the image sensor includes an infrared image sensor.

For example, the display device provided by at least one embodiment of the present disclosure further includes a display panel, the display panel includes a plurality of pixel units arranged in an array, the plurality of pixel units are divided into a plurality of pixel unit groups, and each pixel unit group corresponds to one light source group and one image sensor group.

For example, in the display device provided by at least one embodiment of the present disclosure, the display device includes a display region and a non-display region outside the display region, light sources in the plurality of light source groups and image sensors in the plurality of image sensor groups are distributed in the non-display region of the display device, and the light sources and the image sensors are at a plurality of independent positions on the display side of the display device and/or on a back side, opposite to the display side, of the display device.

For example, in the display device provided by at least one embodiment of the present disclosure, each of the plurality of light-emitting control units includes a pseudo-synchronous sequence unit and a spread-spectrum modulation unit; the pseudo-synchronous sequence unit is configured to provide a pseudo random code sequence, and the spread-spectrum modulation unit is configured to provide a spread-spectrum code sequence and a modulation signal; the first light-emitting control unit is configured to generate the first driving signal according to a pseudo random code sequence of a pseudo-synchronous sequence unit of the first light-emitting control unit, and according to a spread-spectrum code sequence and a modulation signal of a spread-spectrum modulation unit of the first light-emitting control unit; and the second light-emitting control unit is configured to generate the second driving signal according to a pseudo random code sequence of a pseudo-synchronous sequence unit of the second light-emitting control unit, and according to a spread-spectrum code sequence and a modulation signal of a spread-spectrum modulation unit of the second light-emitting control unit.

For example, in the display device provided by at least one embodiment of the present disclosure, the pseudo random code sequence provided by the pseudo-synchronous sequence unit of the first light-emitting control unit for the first light source group is different from the pseudo random code sequence provided by the pseudo-synchronous sequence unit of the second light-emitting control unit for the second light source group; and/or the spread-spectrum code sequence provided by the spread-spectrum modulation unit of the first light-emitting control unit for the first light source group is different from the spread-spectrum code sequence provided by the spread-spectrum modulation unit of the second light-emitting control unit for the second light source group; and/or the modulation signal provided by the spread-spectrum modulation unit of the first light-emitting control unit for the first light source group is different from the modulation signal provided by the spread-spectrum modulation unit of the second light-emitting control unit for the second light source group.

For example, the display device provided by at least one embodiment of the present disclosure further includes a plurality of image signal processing units, and the plurality of image signal processing units include a first image signal processing unit and a second image signal processing unit; the first image signal processing unit is in signal connection with the first image sensor group, and the first image signal processing unit is configured to process a first image signal obtained by the first image sensor group according to the first driving signal provided by the first light-emitting control unit, so as to obtain depth image information of the first partial region of the detection object; and the second image signal processing unit is in signal connection with the second image sensor group, and the second image signal processing unit is configured to process a second image signal obtained by the second image sensor group according to the second driving signal provided by the second light-emitting control unit, so as to obtain depth image information of the second partial region of the detection object.

For example, in the display device provided by at least one embodiment of the present disclosure, each of the plurality of image signal processing units includes a demodulation unit, a de-spreading unit, and a synchronization detecting unit; a demodulation unit of the first image signal processing unit is configured to demodulate the first image signal obtained by the first image sensor group according to the modulation signal of the first light-emitting control unit, and a demodulation unit of the second image signal processing unit is configured to demodulate the second image signal obtained by the second image sensor group according to the modulation signal of the second light-emitting control unit; a synchronization detecting unit of the first image signal processing unit is configured to perform pseudo-code synchronization detecting calculation on the first image signal obtained by the first image sensor group according to the pseudo random code sequence of the first light-emitting control unit, and a synchronization detecting unit of the second image signal processing unit is configured to perform pseudo-code synchronization detecting calculation on the second image signal obtained by the second image sensor group according to the pseudo random code sequence of the second light-emitting control unit; and a de-spreading unit of the first image signal processing unit is configured to de-spread the first image signal obtained by the first image sensor group according to the spread-spectrum code sequence of the first light-emitting control unit, and a de-spreading unit of the second image signal processing unit is configured to de-spread the second image signal obtained by the second image sensor group according to the spread-spectrum code sequence of the second light-emitting control unit.

For example, the display device provided by at least one embodiment of the present disclosure further includes a depth image information merging unit, the depth image information merging unit is configured to merge the depth image information of the first partial region of the detection object obtained through the first image sensor group with the depth image information of the second partial region of the detection object obtained through the second image sensor group, so as to obtain entire depth image information of the detection object.

For example, in the display device provided by at least one embodiment of the present disclosure, the plurality of light source groups further include a third light source group, and the plurality of image sensor groups further include a third image sensor group; the third image sensor group corresponds to the third light source group, and the third light source group is adjacent to the third image sensor group; the first light source group, the second light source group, and the third light source group are separated from each other, and the first image sensor group, the second image sensor group, and the third image sensor group are separated from each other; and the third light source group is configured to emit light of a third determined frequency to the display side of the display device to illuminate a third partial region of the detection object, the third image sensor group is configured to receive the light of the third determined frequency emitted by the third light source group and reflected by the detection object, and the third determined frequency is different from the first determined frequency and different from the second determined frequency.

At least one embodiment of the present disclosure further provides an electronic equipment, and the electronic equipment includes the display device provided by any one of the embodiments of the present disclosure.

At least one embodiment of the present disclosure further provides a method for driving a display device, and the method includes: driving a first light source group to emit light of a first determined frequency to a display side of the display device to illuminate a first partial region of a detection object, and driving a second light source group to emit light of a second determined frequency to the display side of the display device to illuminate a second partial region of the detection object, the first determined frequency being different from the second determined frequency; and driving a first image sensor group to receive the light of the first determined frequency emitted by the first light source group and reflected by the detection object, so as to obtain a first image signal comprising depth image information of the first partial region of the detection object, and driving a second image sensor group to receive the light of the second determined frequency emitted by the second light source group and reflected by the detection object, so as to obtain a second image signal comprising depth image information of the second partial region of the detection object.

For example, the method for driving the display device provided by at least one embodiment of the present disclosure further includes: merging the depth image information of the first partial region of the detection object obtained through the first image sensor group with the depth image information of the second partial region of the detection object obtained through the second image sensor group.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects.

Figure 1:
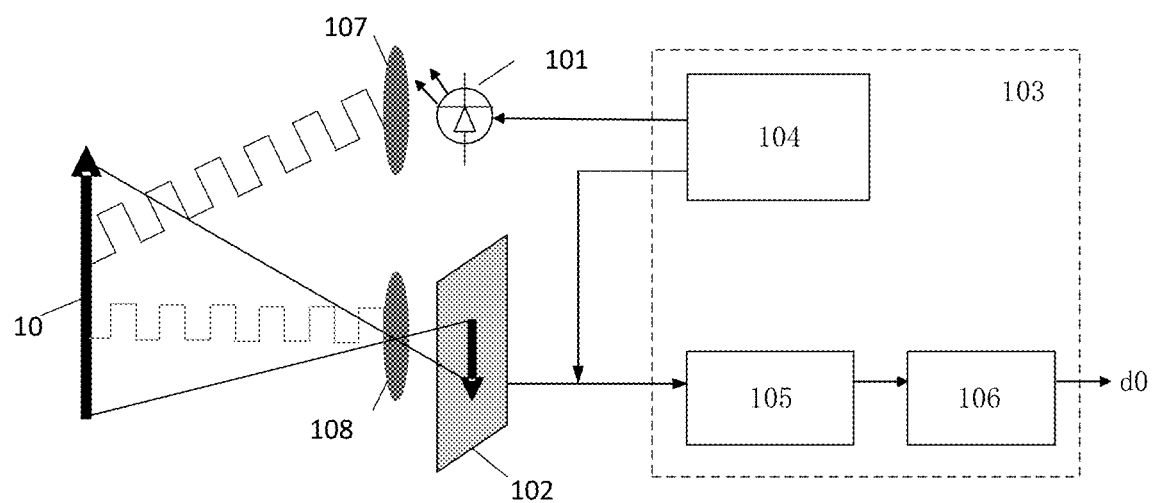
FIG. 1 is a schematic diagram of a time of flight (TOF) depth camera module detection system.

In the depth image information detection technology, a depth camera is usually used to acquire the depth image information. FIG. 1 is a schematic diagram of a time of flight (TOF) depth camera module detection system. As illustrated in FIG. 1, the detection system includes a detection light source 101, a receiving array 102, and a control circuit 103, and the control circuit 103 includes a modulation and demodulation unit 104, an analog-to-digital converter 105, and a calculation unit 106. Firstly, the modulation and demodulation unit 104 controls the detection light source 101 to emit a beam of modulated light (for example, modulated infrared light), and the modulated infrared light is irradiated to a detection object 10 (for example, a human body) after passing through an optical component 107 (for example, a lens) and then is reflected by the detection object 10. The reflected infrared light is received by the receiving array 102 after passing through another optical component 108 (for example, a lens) and is converted into an electric signal. Then the modulation and demodulation unit 104 demodulates the electric signal corresponding to the received infrared light, the demodulated signal is subjected to analog-to-digital conversion by the analog-to-digital converter 105, and the calculation unit 106 calculates a value d0 of distance from the detection object 10 to the TOF depth camera module according to the signal subjected to the analog-to-digital conversion.

The TOF depth camera module detection system uses an independent depth camera module and measures the depth distance of the detection object 10 by calculating the round-trip time of the light, thereby implementing spatially positioning of the detection object 10. However, in the detection system, the optical image sensor used in the depth camera module is usually a silicon-based image sensor (for example, a complementary metal oxide semiconductor (CMOS) image chip), and the size of the silicon-based image sensor is large and is generally on a centimeter (cm) magnitude. Therefore, the depth camera module is difficult to be miniaturized and cannot be directly provided in the display region of the display device, so that it is difficult to integrate the depth camera module with the display screen to implement space positioning with a high resolution. Moreover, it is also difficult to manufacture a corresponding optical lens for such a large-sized optical image sensor, so that it is difficult to implement large-scale practical application.

Therefore, in order to satisfy requirements of practical applications, a plurality of smaller-sized image sensors can be provided (e.g., transferred) in the display device to integrate a display device with a depth image information detection function and a display function. However, because the plurality of image sensors are in a relatively concentrated arrangement in the display device, each image sensor is vulnerable to interference from other image sensors during the image signal receiving process and is difficult to accurately obtain the image signal of the required detection region. Therefore, it is difficult to obtain ideal depth image information after integrating and processing all the image signals received by the plurality of image sensors, so that it is further difficult to perform high-precision spatial interactive operations based on the obtained interactive information.

In addition, in interactive applications such as 3D display, virtual reality (VR), augmented reality (AR), etc., because multi-angle and multi-dimension spatial interactive information needs to be acquired and extracted, the infrared light emitted by the light source is vulnerable to interference from surrounding ambient light or adjacent light sources, so that it is more difficult for the image sensor to obtain an accurate image signal. Further, it is difficult for the display device to restore and identify the original image information of the detection object, and it is difficult to implement precise spatial interaction with the detection object.

At least one embodiment of the present disclosure provides a display device, the display device includes a plurality of light source groups and a plurality of image sensor groups in one-to-one correspondence, and the plurality of light source groups and the corresponding plurality of image sensor groups are distributed in different regions of the display device. Each light source group emits light of different determined frequencies to illuminate different regions of the detection object, and each image sensor group only receives the light of the determined frequency emitted by the corresponding light source group and reflected by the detection object, so that each image sensor group can accurately receive the light emitted by the corresponding light source group and reflected by the corresponding region of the detection object, and may not be interfered by light emitted by other light source groups. Therefore, after processing all the image signals acquired by the plurality of image sensor groups, accurate depth image information of the detection object can be obtained, thereby enabling the display device to implement a high-precision spatial interaction function. In addition, the display device controls the plurality of light source groups and the plurality of image sensor groups to work simultaneously, so that while implementing high-precision spatial interaction, the time required for the display device to acquire the entire depth image information of the detection object is greatly reduced, thereby facilitating improving detection efficiency.

At least one embodiment of the present disclosure further provides an electronic equipment which includes the above-mentioned display device, and a method for driving a display device.

Hereinafter, some embodiments of the present disclosure are described in detail with reference to the accompanying drawings. It should be noted that the same reference numerals in different drawings are used to refer to the same described components.

Figure 2:
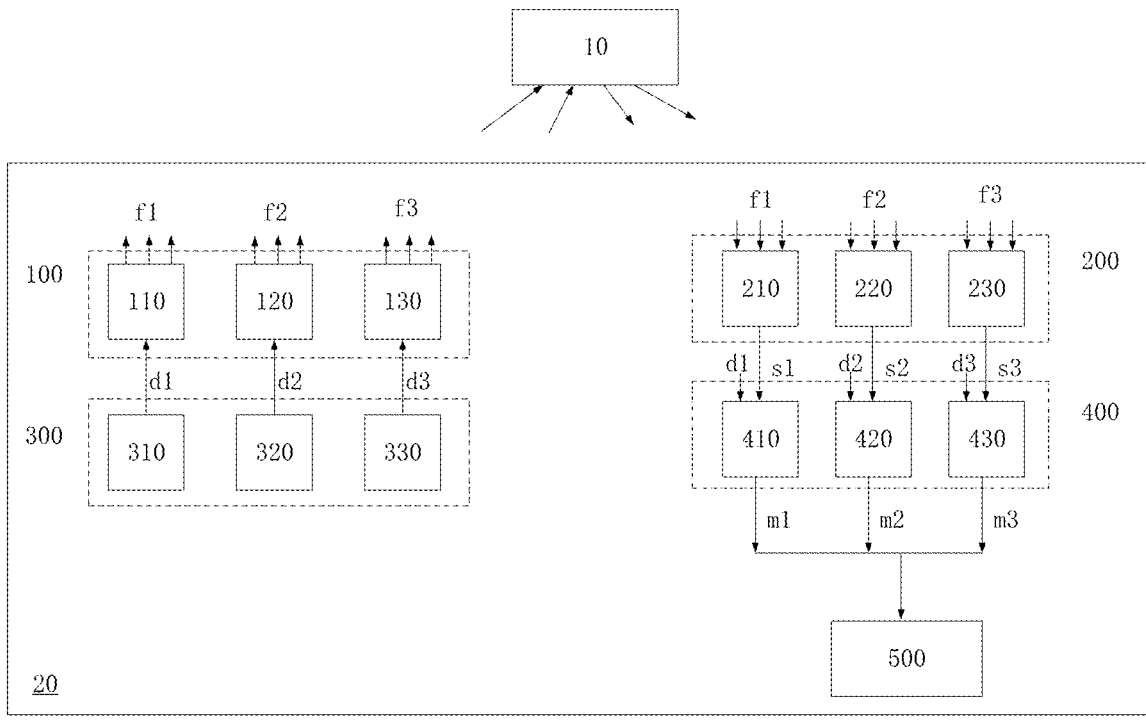
FIG. 2 is a schematic block diagram of a display device provided by some embodiments of the present disclosure.

FIG. 2 is a schematic block diagram of a display device 20 provided by some embodiments of the present disclosure. As illustrated in FIG. 2, the display device 20 includes a plurality of light source groups 100, a plurality of image sensor groups 200, a plurality of light-emitting control units 300, a plurality of image signal processing units 400, and a depth image information merging unit 500. It should be noted that FIG. 2 only reflects the signal relationship between the objects or units in the display device 20, and does not reflect the position relationship between the objects or units in the display device 20.

As illustrated in FIG. 2, the plurality of light source groups 100 include, but are not limited to, a first light source group 110, a second light source group 120, and a third light source group 130, and the first light source group 110, the second light source group 120, and the third light source group 130 emit light of different determined frequencies to a display side of the display device 20, respectively, so that the light of each determined frequency can be received by the corresponding image sensor group after being reflected by a detection object 10. For example, the first light source group 110 is configured to emit light of a first determined frequency f1 to the display side of the display device 20 to illuminate a first partial region r1 of the detection object 10, the second light source group 120 is configured to emit light of a second determined frequency f2 to the display side of the display device 20 to illuminate a second partial region r2 of the detection object 10, the third light source group 130 is configured to emit light of a third determined frequency f3 to the display side of the display device 20 to illuminate a third partial region r3 of the detection object 10, and the first determined frequency f1, the second determined frequency f2, and the third determined frequency f3 are different from each other.

For example, because the frequencies of light emitted by the first light source group 110, the second light source group 120, and the third light source group 130 are different from each other, the light of the respective frequencies may not interfere with each other, thereby allowing the display device 20 to drive the plurality of light source groups 100 to work simultaneously, and effectively reducing the sampling period for acquiring the depth image information of the detection object 10.

As illustrated in FIG. 2, the plurality of image sensor groups 200 include a first image sensor group 210, a second image sensor group 220, and a third image sensor group 230, and the first image sensor group 210, the second image sensor group 220, and the third image sensor group 230 are configured to receive light of different determined frequencies, respectively. For example, the first image sensor group 210 is configured to receive the light of the first determined frequency f1 emitted by the first light source group 110 and reflected by the detection object 10, so as to obtain a first image signal s1 comprising depth image information of the first partial region r1 of the detection object 10; the second image sensor group 220 is configured to receive the light of the second determined frequency f2 emitted by the second light source group 120 and reflected by the detection object 10, so as to obtain a second image signal s2 comprising depth image information of the second partial region r2 of the detection object 10; and the third image sensor group 230 is configured to receive the light of the third determined frequency f3 emitted by the third light source group 130 and reflected by the detection object 10, so as to obtain a third image signal s3 comprising depth image information of the third partial region r3 of the detection object 10.

For example, the first image sensor group 210 is configured to only receive and detect the light of the first determined frequency f1. For example, when light of other determined frequencies (such as the second determined frequency f2 or the third determined frequency f3) is reflected by the detection object 10 and irradiated to the first image sensor group 210, the light of those determined frequencies cannot be detected by the first image sensor group 210, that is, the first image sensor group 210 cannot perform operations such as demodulation, de-spreading, synchronization detecting calculation, or the like on light wave signals of those determined frequencies. Therefore, when light of a determined frequency other than the first determined frequency f1 is irradiated to the first image sensor group 210, the first image sensor group 210 may filter out light wave signals of other determined frequencies, thereby obtaining the first image signal s1 with a relatively high signal-to-noise ratio. The image signal acquiring principle of the second image sensor group 220 and the third image sensor group 230 is the same as that of the first image sensor group 210, and details are not described herein again.

For example, because the first image sensor group 210 only receives and detects the light of the first determined frequency f1, the second image sensor group 220 only receives and detects the light of the second determined frequency f2, and the third image sensor group 230 only receives and detects the light of the third determined frequency f3, therefore, in the process of acquiring the image signal, each image sensor group can filter out ambient light or other light wave signals of determined frequencies different from the corresponding determined frequency, thereby obtaining the image signal with a relatively high signal-to-noise ratio. Therefore, in some embodiments of the present disclosure, in the case where all the plurality of image sensor groups 200 are integrated with the display device 20, each image sensor group can accurately obtain the image signal of the corresponding region of the detection object 10, so that after all the acquired image signals are analyzed and processed, the display device 20 can obtain accurate depth image information of the detection object 10, thereby enabling the display device 20 to implement a high-precision spatial interaction function.

For example, the first light source group 110, the second light source group 120, and the third light source group 130 are separated from each other, the first image sensor group 210, the second image sensor group 220, and the third image sensor group 230 are separated from each other, and each light source group is disposed in an adjacent region of the corresponding image sensor group. That is, the first light source group 110 and the first image sensor group 210 are adjacent to each other, the second light source group 120 and the second image sensor group 220 are adjacent to each other, and the third light source group 130 and the third image sensor group 230 are adjacent to each other. For example, each light source group and each corresponding image sensor group may be arranged in an array in the display device 20, and the embodiments of the present disclosure include, but are not limited to, such an arrangement.

Therefore, the display device 20 can obtain the entire depth image information of the detection object 10 through the plurality of light source groups 100 and the plurality of image sensor groups 200, and the plurality of image sensor groups 200 may not interfere with each other in the process of acquiring the image signals, thereby allowing the display device 20 to drive the plurality of light source groups 100 and the plurality of image sensor groups 200 to work simultaneously, and further greatly reducing the period required for acquiring depth image information.

As illustrated in FIG. 2, the plurality of light-emitting control units 300 include a first light-emitting control unit 310, a second light-emitting control unit 320, and a third light-emitting control unit 330, which are used to control the corresponding plurality of light source groups 100, respectively. For example, the first light-emitting control unit 310 is in signal connection with (e.g., electrically connected to) the first light source group 110 and provides a first driving signal d1 to the first light source group 110, so as to allow the first light source group 110 to emit the light of the first determined frequency f1; the second light-emitting control unit 320 is in signal connection with the second light source group 120 and provides a second driving signal d2 to the second light source group 120, so as to allow the second light source group 120 to emit the light of the second determined frequency f2; and the third light-emitting control unit 330 is in signal connection with the third light source group 130 and provides a third driving signal d3 to the third light source group 130, so as to allow the third light source group 130 to emit the light of the third determined frequency f3. The first driving signal d1, the second driving signal d2, and the third driving signal d3 are different from each other, and for example, any one or more of parameters such as the frequency, amplitude, phase, and waveform of respective driving signals are different.

For example, respective light-emitting control units may allow respective light source groups to emit light of different determined frequencies by providing different driving signals to each corresponding light source group, so that light emitted by the plurality of light source groups may not interfere with each other. For example, respective light-emitting control units can be provided with different pseudo random code sequences, so that respective light-emitting control units can generate different driving signals according to different pseudo random code sequences to drive the corresponding respective light source groups to emit light of different determined frequencies, and therefore, the light emitted by adjacent light source groups may not interfere with each other. For example, each light-emitting control unit may also perform, for example, modulation and spread-spectrum processing on the generated pseudo random code sequence, so that the light (for example, the emitted light is a square wave signal) emitted by the corresponding light source group may not be interfered or affected by ambient light, and each image sensor group corresponding to each light source group can receive the corresponding reflected light and obtain the accurate image signal, thereby enabling the display device 20 to obtain high-precision depth image information of the detection object 10.

For example, the first light-emitting control unit 310, the second light-emitting control unit 320, and the third light-emitting control unit 330 may be integrated in the same control unit of the display device 20. The control circuit may be manufactured on the array substrate of the display device 20 by using a semiconductor process, or may be implemented as an integrated circuit (IC) chip and in signal connection with the plurality of light source groups 100 provided in the display device 20 through a flexible circuit board. Alternatively, the first light-emitting control unit 310, the second light-emitting control unit 320, and the third light-emitting control unit 330 may also be integrated in the corresponding light source groups, respectively, and the embodiments of the present disclosure are not limited in this aspect.

As illustrated in FIG. 2, the plurality of image signal processing units 400 include a first image signal processing unit 410, a second image signal processing unit 420, and a third image signal processing unit 430, which are used to process the image signals obtained by the plurality of image sensor groups 200, respectively. For example, the first image signal processing unit 410 is in signal connection with the first image sensor group 210 and processes the first image signal s1 obtained by the first image sensor group 210 according to the first driving signal d1 provided by the first light-emitting control unit 310, so as to obtain depth image information m1 of the first partial region r1 of the detection object 10; the second image signal processing unit 420 is in signal connection with the second image sensor group 220 and processes the second image signal s2 obtained by the second image sensor group 220 according to the second driving signal d2 provided by the second light-emitting control unit 320, so as to obtain depth image information m2 of the second partial region r2 of the detection object 10; and the third image signal processing unit 430 is in signal connection with the third image sensor group 230 and processes the third image signal s3 obtained by the third image sensor group 230 according to the third driving signal d3 provided by the third light-emitting control unit 330, so as to obtain depth image information m3 of the third partial region r3 of the detection object 10.

For example, the image signal processing unit may perform, for example, demodulation, de-spreading, and pseudo-code synchronization detecting calculation on the image signal obtained by each image sensor group according to the driving signal provided by the corresponding light-emitting control unit, so as to obtain depth image information of the corresponding region of the detection object 10, so that the display device 20 can obtain accurate and high-precision depth image information while ensuring that the image signal received by each image sensor group cannot be interfered by adjacent light sources or ambient light.

For example, as illustrated in FIG. 2, the depth image information merging unit 500 merges the depth image information m1 of the first partial region r1 of the detection object 10 obtained through the first image sensor group 210, the depth image information m2 of the second partial region r2 of the detection object 10 obtained through the second image sensor group 220, and the depth image information m3 of the third partial region r3 of the detection object 10 obtained through the third image sensor group 230 together, so as to obtain the entire depth image information of the detection object 10.

It should be noted that although only three groups of corresponding image sensors, light sources, light-emitting control units, and image signal processing units are illustrated in FIG. 2, the display device 20 may further include two or more groups of corresponding image sensors, light sources, light-emitting control units, and image signal processing units. For example, the display device 20 may further include a fourth light source group, a fourth image sensor group, a fourth light-emitting control unit, and a fourth image signal processing unit, and may further include a fifth light source group, a fifth image sensor group, a fifth light-emitting control unit, and a fifth image signal processing unit, etc., and the embodiments of the present disclosure are not limited in this aspect.

Hereinafter, the first light source group 110, the first image sensor group 210, the first light-emitting control unit 310, and the first image signal processing unit 410 are taken as an example to describe the image signal acquiring process of the display device 20.

Figure 3A:
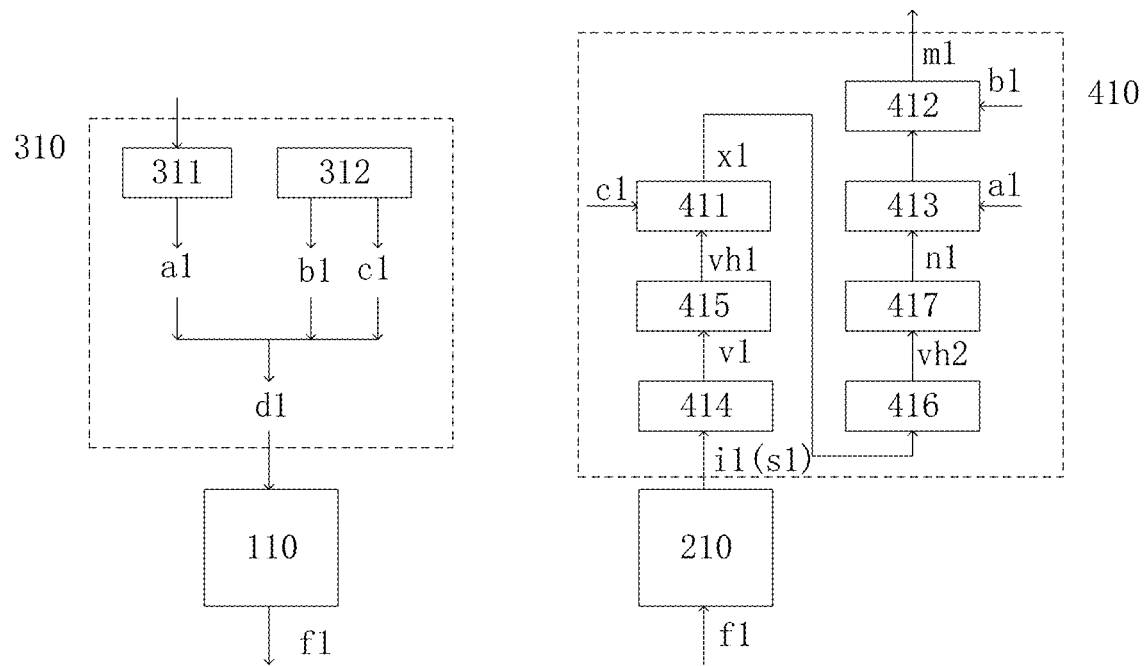
FIG. 3A and FIG. 3B are control flowcharts of a method for acquiring an image signal provided by some embodiments of the present disclosure.

FIG. 3A is a control flowchart of a method for acquiring an image signal provided by some embodiments of the present disclosure. For example, as illustrated in FIG. 3A, the first light-emitting control unit 310 includes, for example, a pseudo-synchronous sequence unit 311 and a spread-spectrum modulation unit 312. The pseudo-synchronous sequence unit 311 is configured to provide a pseudo random code sequence a1, the spread-spectrum modulation unit 312 is configured to provide a spread-spectrum code sequence b1 and a modulation signal c1, and the first light-emitting control unit 310 is configured to generate the first driving signal d1 according to the pseudo random code sequence a1, the spread-spectrum code sequence b1, and the modulation signal c1.

Figure 3B:
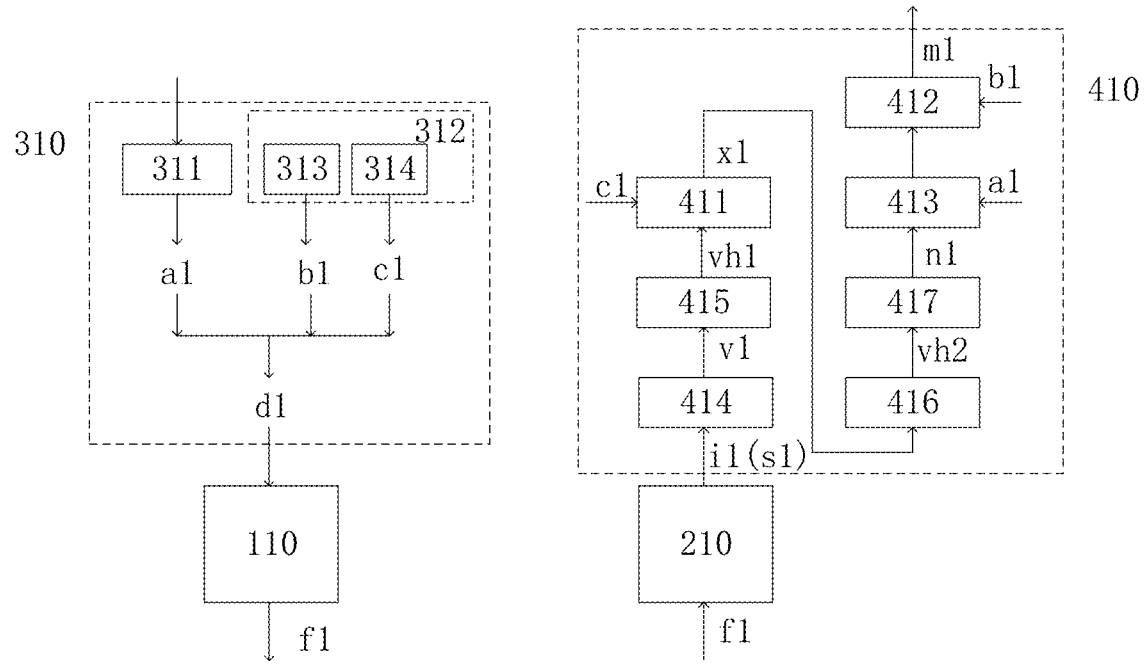

For example, in some embodiments of the present disclosure, as illustrated in FIG. 3B, the spread-spectrum modulation unit 312 of the first light-emitting control unit 310 may include a spread-spectrum unit 313 and a modulation unit 314, the spread-spectrum unit 313 is configured to provide the spread-spectrum code sequence b1, and the modulation unit 314 is configured to provide the modulation signal c1, which are not limited in the embodiments of the present disclosure.

Because each light-emitting control unit needs to provide a different driving signal to the corresponding light source group, and the driving signal of each light-emitting control unit is determined by the pseudo random code sequence, the spread-spectrum code sequence, and the modulation signal of each light-emitting control unit, therefore, by taking the first light-emitting control unit 310 and the second light-emitting control unit 320 as an example, at least one of the pseudo random code sequence a1, the spread-spectrum code sequence b1, and the modulation signal c1 of the first light-emitting control unit 310 is different from the corresponding one of the pseudo random code sequence a2, the spread-spectrum code sequence b2, and the modulation signal c2 of the second light-emitting control unit 320. That is, at least one of the following conditions is satisfied: the pseudo random code sequence a1≠the pseudo random code sequence a2, the spread-spectrum code sequence b1≠the spread-spectrum code sequence b2, and the modulation signal c1≠the modulation signal c2. For example, only one of the pseudo random code sequence, the spread-spectrum code sequence, and the modulation signal may be different, or all of the pseudo random code sequence, the spread-spectrum code sequence, and the modulation signal may be different.

For example, the pseudo random code sequence has a sharp autocorrelation, that is, only when the first image signal s1 obtained by the first image sensor group 210 is related to the pseudo random code sequence a1 provided in the first light-emitting control unit 310, the image processing unit 410 can obtain useful depth image information through the first image signal s1. For example, the pseudo random code sequence generated by the pseudo-synchronous sequence unit of each light-emitting control unit may have good autocorrelation and crosscorrelation with each other, so that the frequency of ambient light is difficult to match the determined frequency of the light emitted by each light source group. Therefore, the corresponding image sensor group can filter out the ambient light or other light of different determined frequencies when receiving the light wave signal, thereby obtaining the image signal with a high signal-to-noise ratio and facilitating analysis of high-precision depth image information for each image processing unit. Therefore, in order to optimize the control flow of the display device 20 during performing the image signal acquiring operation, for example, the plurality of light-emitting control units 300 of the display device 20 may be provided with pseudo random code sequences with good autocorrelation and crosscorrelation with each other, that is, the pseudo random code sequences generated by the pseudo-synchronous sequence units of respective light-emitting control units are related with but different from each other, so that the spread-spectrum modulation units of respective light-emitting control units only need to provide the same spread-spectrum code sequence and the same modulation signal. Therefore, under the premise of ensuring that respective light-emitting control units generate different driving signals, the control algorithm of the display device 20 is optimized and simplified, thereby saving the storage space that the display device 20 needs to be allocated, lowering requirements of the computing capacity of the display device 20, and greatly improving the operating speed of the display device 20.

In addition, for example, in a large-sized display device 20 having the plurality of light source groups 100 and the corresponding plurality of light-emitting control units 300 provided by some embodiments of the present disclosure, in the case where the first light source group 110 is far away from the second light source group 120, the first light-emitting control unit 310 and the second light-emitting control unit 320 can be provided with the same pseudo random code sequence. For example, the pseudo-synchronous sequence unit 311 of the first light-emitting control unit 310 and the pseudo-synchronous sequence unit 321 of the second light-emitting control unit 320 may provide the same pseudo random code sequence, while the spread-spectrum unit 313 of the first light-emitting control unit 310 and the spread-spectrum unit 323 of the second light-emitting control unit 320 provide different spread-spectrum code sequences, or the modulation unit 314 of the first light-emitting control unit 310 and the modulation unit 324 of the second light-emitting control unit 320 provide different modulation signals, or the first light-emitting control unit 310 and the second light-emitting control unit 320 provide different spread-spectrum code sequences and different modulation signals. Therefore, the storage space allocated by the display device 20 for storing the pseudo random code sequence can be further saved, and the requirements of the computing capacity of the display device 20 can be further lowered, thereby improving the operating speed of the display device 20. It should be noted that in some embodiments of the present disclosure, the pseudo random code sequences of all the light-emitting control units may be different from each other, or only some of the pseudo random code sequences of the light-emitting control units are different from each other, that is, the pseudo random code sequences of some other light-emitting control units are the same, and the embodiments of the present disclosure are not limited in this aspect.

For example, in the display device 20 provided by some embodiments of the present disclosure, the time delay of the light of the determined frequency emitted by each light source group can be calculated by calculating a characteristic phase of the spread-spectrum code sequence provided by the light-emitting control unit, thereby obtaining a value d of distance from the detection object 10 to the display device 20. For example, $d=0.5 \times c \times t$, where c is the speed of light, and t is the period from the moment when one light source group emits the light of the determined frequency to illuminate the detection object 10 to the moment when the corresponding image sensor group receives the light of the determined frequency reflected by the detection object 10. For example, the accuracy of the distance value d depends on the symbol width of the spread-spectrum code sequence, the symbol width of the spread-spectrum code sequence can be designed to be very narrow, and the period of the spread-spectrum code sequence can also be designed to be any time, so that the display device 20 can obtain a high-precision distance value d of the detection object 10.

For example, as illustrated in FIG. 3A, the first image signal processing unit 410 includes a demodulation unit 411, a de-spreading unit 412, and a synchronization detecting unit 413. The demodulation unit 411 is configured to demodulate the first image signal s1 obtained by the first image sensor group 210 according to the modulation signal c1, the synchronization detecting unit 413 is configured to perform pseudo-code synchronization detecting calculation on the first image signal s1 according to the pseudo random code sequence a1, and the de-spreading unit 412 is configured to de-spread the first image signal s1 according to the spread-spectrum code sequence b1. For example, the modulation signal c1, the pseudo random code sequence a1, and the spread-spectrum code sequence b1 may be directly provided by the first light-emitting control unit 310 to the first image signal processing unit 410, or may be provided by a control circuit (such as a chip, not illustrated in the figure) that controls the first light-emitting control unit 310, and for example, the control circuit provides the corresponding modulation signal c1, pseudo random code sequence a1, and spread-spectrum code sequence b1 to the first light-emitting control unit 310 and the first image signal processing unit 410, respectively.

For example, as illustrated in FIG. 3A, the first image signal processing unit 410 may further include a current-to-voltage conversion unit 414, a filter amplification unit 415, a low-pass filter unit 416, and an analog-to-digital conversion unit 417. For example, the current-to-voltage conversion unit 414 is configured to perform current-to-voltage conversion on the first image signal s1, the filter amplification unit 415 is configured to perform filtering and amplification processing on the first image signal s1, the low-pass filter unit 416 is configured to perform low-pass filtering on the first image signal s1, and the analog-to-digital conversion unit 417 is configured to perform analog-to-digital conversion on the first image signal s1.

For example, as illustrated in FIG. 3A, after the pseudo-synchronous sequence unit 311 generates the pseudo random code sequence a1, the pseudo random code sequence a1 is subjected to spread-spectrum modulation processing according to the spread-spectrum code sequence b1 and the modulation signal c1 generated by the spread-spectrum modulation unit 312 to generate the first driving signal d1, and the first driving signal d1 is provided to the first light source group 110 to drive the first light source group 110 to emit the light of the first determined frequency f1, thereby illuminating the first partial region r1 of the detection object 10. The light of the first determined frequency f1 is received by the first image sensor group 210 after being reflected by the detection object 10, and for example, a current signal i1 (i.e., the first image signal s1) is generated according to the photoelectric effect. The current-to-voltage conversion unit 414 converts the current signal it into a voltage signal v1, and the filter amplification unit 415 performs filtering and amplification processing on the voltage signal v1 to convert the voltage signal v1 into a first filtered signal vh1. The demodulation unit 411 demodulates the first filtered signal vh1, which is filtered and amplified, according to the modulation signal c1 of the first light-emitting control unit 310, and then transmits a demodulated electrical signal x1 to the low-pass filter unit 416. The low-pass filter unit 416 performs low-pass filtering on the demodulated electrical signal x1 to convert the demodulated electrical signal x1 into a second filtered signal vh2, and the second filtered signal vh2 is converted into a digital signal n1 by the analog-to-digital conversion unit 417. Finally, the synchronization detecting unit 413 and the de-spreading unit 412 perform pseudo-code synchronization detecting calculation and de-spreading on the digital signal n1 according to the pseudo random code sequence a1 and the spread-spectrum code sequence b1 of the first light-emitting control unit 310, respectively, and the information such as the phase and amplitude of the first image signal s1 is obtained, thereby obtaining the depth image information m1 that represents the first partial region r1 of the detection object 10.

Figure 4:
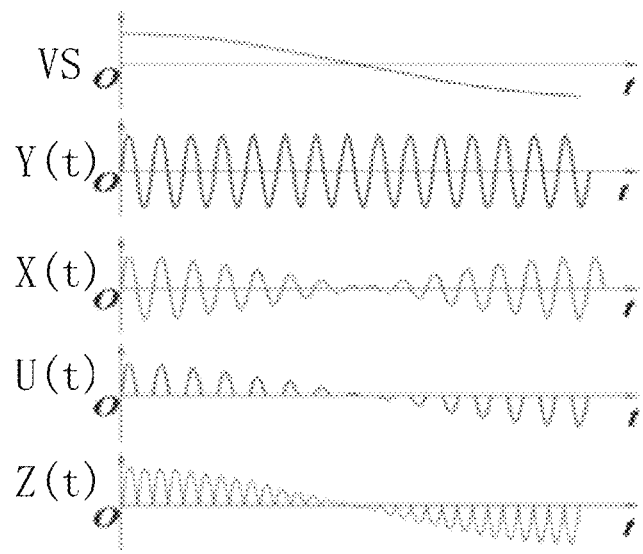
FIG. 4 is a signal waveform diagram corresponding to a modulation processing phase and a demodulation processing phase in the method for acquiring the image signal illustrated in FIG. 3A and FIG. 3B.

FIG. 4 is a signal waveform diagram corresponding to a modulation processing phase and a demodulation processing phase in the method for acquiring the image signal illustrated in FIG. 3A and FIG. 3B. For example, in an example, the unmodulated signal Vs (for example, the pseudo random code sequence a1 after spread-spectrum processing according to the spread-spectrum code sequence b1) of the first light-emitting control unit 310 is illustrated in FIG. 4, the modulation signal c1 of the first light-emitting control unit 310 is a sine wave signal Y(t) with a modulation angle of $\theta_0$ and a modulation angle frequency of $w_0$ as illustrated in FIG. 4, the signal Vs is modulated by using the sine wave signal Y(t) to obtain a modulated signal W(t) (not illustrated in FIG. 4, for example, the corresponding first driving signal d1 in FIG. 3A), and the modulated signal W(t) is provided to the first light source group 110 to drive the first light source group 110 to emit the light of the first determined frequency f1. After the first image sensor group 210 receives the light of the first determined frequency f1 reflected by the detection object 10, operations, for example, current-to-voltage conversion, filtering and amplification processing, are performed on the signal to obtain a double-sideband modulated signal X(t) (for example, the corresponding first filtered signal vh1 in FIG. 3A) as illustrated in FIG. 4, that is, $X(t)=Vs \times \cos(w_0 t+\theta_0)$. The demodulation unit 411 of the first image processing unit 410 demodulates the double-sideband modulated signal X(t) according to the modulation signal c1 (i.e., the sine wave signal Y(t)) of the first light-emitting control unit 310. That is, a carrier signal (for example, a carrier signal Vr with a modulation angle of $\theta_1$ and a modulation angle frequency of $w_0$) with the same frequency and a fixed phase difference is used to multiply the double-sideband modulated signal X(t), so as to obtain a half-wave phase-sensitive modulation and demodulation signal U(t) (i.e., the corresponding demodulated electrical signal x1 in FIG. 3A):

$$U(t) = Vs \times \cos(w_0 t + \theta_0) \times Vr \times \cos(w_0 t + \theta_1) = $$
$$0.5 VsVr \times \cos(\theta_0 - \theta_1) + 0.5 VsVr \times \cos(2w_0 t + \theta_0 + \theta_1)$$

For example, in the case where $\theta_0 = \theta_1$, it can be obtained that:

$$U(t)=0.5VsVr+0.5VsVr\times\cos(2w_0 t+2\theta_0)$$

For example, after the half-wave phase-sensitive modulation and demodulation signal U(t) illustrated in FIG. 4 is filtered and amplified by the filter amplification unit 415, a full-wave phase-sensitive modulation and demodulation signal Z(t) (i.e., the corresponding second filtered signal vh2 in FIG. 3A) illustrated in FIG. 4 can be obtained.

The working principles of the other light-emitting control units and the image signal processing units of the display device 20 are similar to the working principles of the first light-emitting control unit 310 and the first image signal processing unit 410, and details are not described herein again. For example, the more detailed description of the working principles of the first light-emitting control unit 310 and the first image signal processing unit 410 can be with reference to the common spread-spectrum modulation technology, which is not described in detail herein.

In some embodiments of the present disclosure, each of the plurality of light source groups 100 may include at least one light source, and each of the plurality of image sensor groups 200 may include at least one image sensor. For example, the first light source group 110 may include at least one first light source, the first image sensor group 210 may include at least one first image sensor, the second light source group 120 may include at least one second light source, and the second image sensor group 220 may include at least one second image sensor.

Figure 5A:
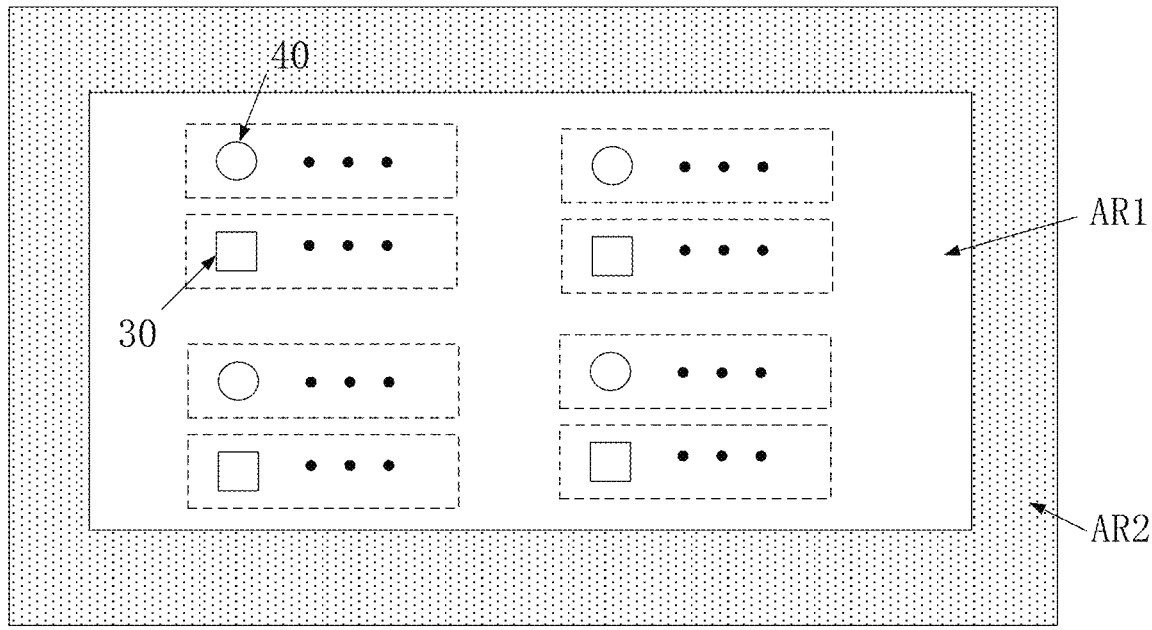
FIG. 5A to FIG. 5C are schematic diagrams of planar distribution of image sensors and light sources of a display device provided by some embodiments of the present disclosure.
Figure 5B:
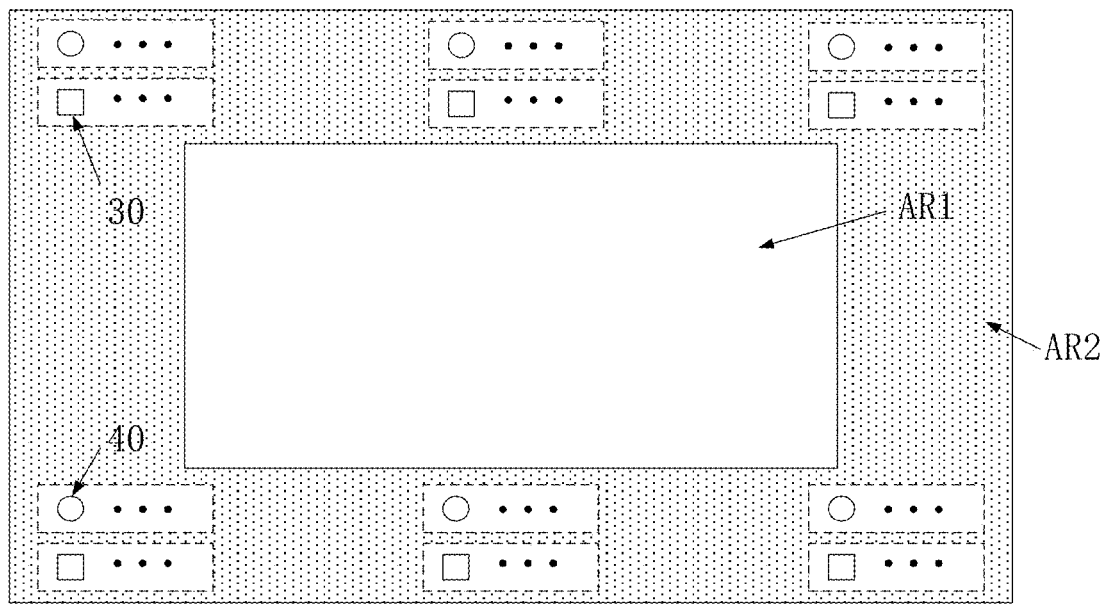
Figure 5C:
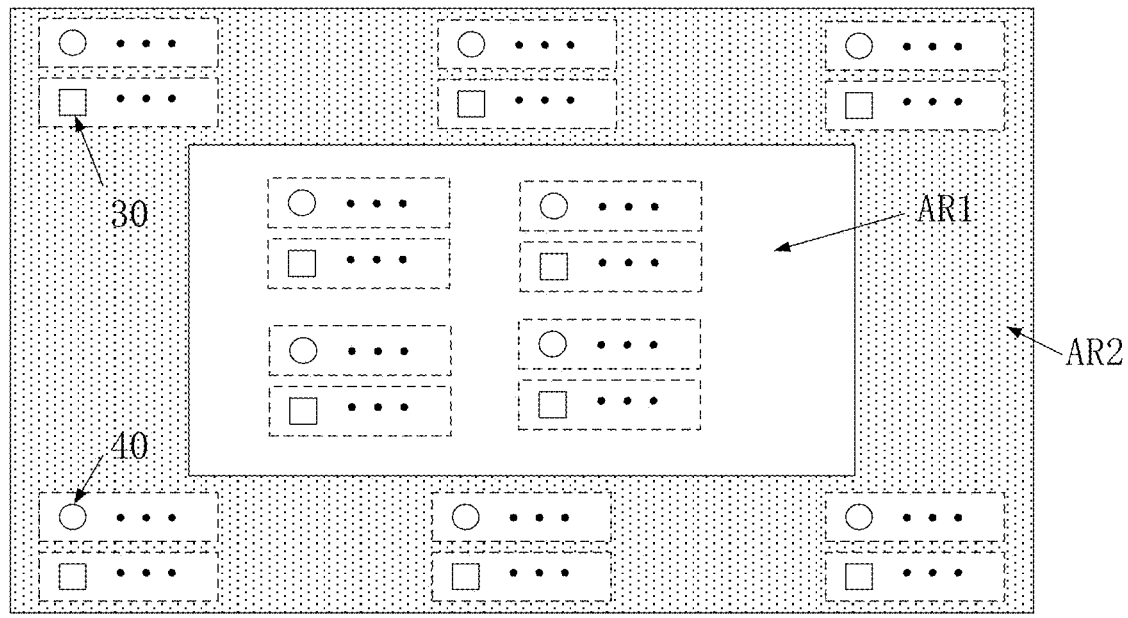

For example, the display device 20 includes a display region AR1 and a non-display region AR2 outside the display region AR1. For example, as illustrated in FIG. 5A, a plurality of image sensors 30 in the plurality of image sensor groups 200 and a plurality of light sources 40 in the plurality of light source groups 100 of the display device 20 may be distributed in the display region AR1 of the display device 20; or as illustrated in FIG. 5B, the plurality of image sensors 30 in the plurality of image sensor groups 200 and the plurality of light sources 40 in the plurality of light source groups 100 may also be distributed in the non-display region AR2 of the display device 20. Alternatively, as illustrated in FIG. 5C, the plurality of image sensors 30 in the plurality of image sensor groups 200 and the plurality of light sources 40 in the plurality of light source groups 100 may also be distributed in both the display region AR1 and the non-display region AR2 of the display device 20, and the embodiments of the present disclosure are not limited in this aspect.

It should be noted that in the case where the plurality of image sensors 30 and the plurality of light sources 40 are distributed in the display region AR1 of the display device 20, the plurality of image sensors 30 and the plurality of light sources 40 may be disposed at a plurality of independent positions on a back side, opposite to the display side, of the display device 20. In the case where the plurality of image sensors 30 and the plurality of light sources 40 are distributed in the non-display region AR2 of the display device 20, the plurality of image sensors 30 and the plurality of light sources 40 may be disposed at a plurality of independent positions on the display side of the display device 20, or may also be disposed at a plurality of independent positions on the back side, opposite to the display side, of the display device 20, and the embodiments of the present disclosure are not limited in this aspect.

For example, the display device 20 further includes a display panel. The display panel includes a plurality of pixel units arranged in an array, the plurality of pixel units may be divided into a plurality of groups, and each group of the pixel units corresponds to one light source group and one image sensor group corresponding to the light source group.

For example, each light source group may include a plurality of light sources, each corresponding image sensor group may include a plurality of image sensors, and the plurality of light sources and the plurality of image sensors may be arranged around the group of pixel units, for example, at equal intervals, so that after merging a plurality of depth image information obtained by the plurality of image sensors in the group together, depth image information of the partial region, corresponding to the image sensor group, of the detection object 10 can be obtained. For example, the plurality of light sources and the plurality of image sensors may also be arranged in the group of pixel units, for example, in an array, and the embodiments of the present disclosure are not limited in this aspect.

Figure 6A:
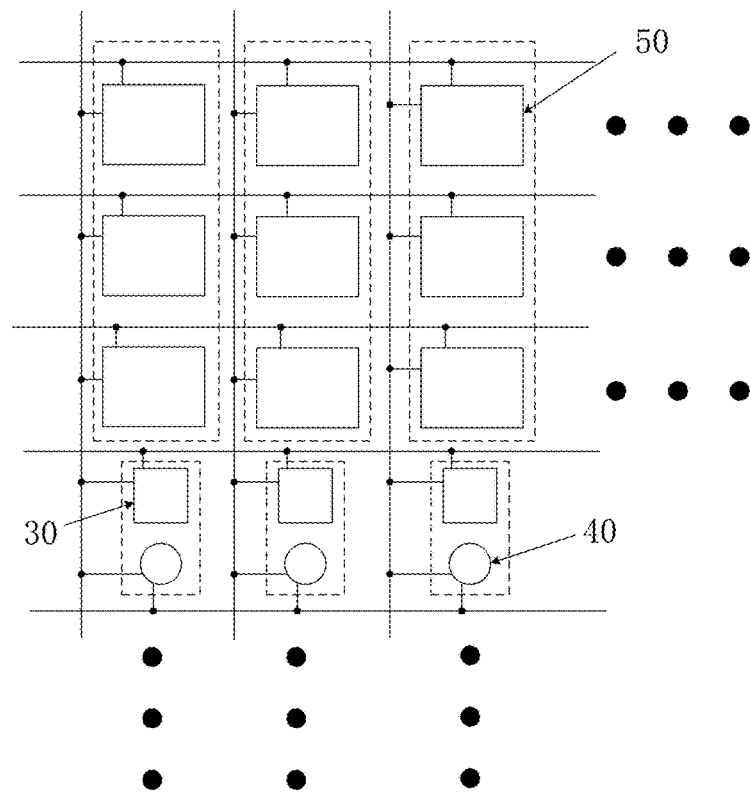
FIG. 6A and FIG. 6B are perspective diagrams of partial structures of a display device provided by some embodiments of the present disclosure.

For example, each light source group may include one light source, and each corresponding image sensor group may include one image sensor, that is, each group of the pixel units corresponds to one light source and one image sensor. For example, as illustrated in FIG. 6A, by taking the case where the plurality of image sensors 30 and the plurality of light sources 40 are distributed in the display region of the display device 20 as an example, three pixel units 50 may be taken as a group, that is, every three pixel units 50 correspond to one light source 40 and one image sensor 30. For example, the plurality of light sources 40 and the plurality of image sensors 30 in the display device 20 may be arranged in an array and disposed within a spacing between two adjacent pixel units 50.

Figure 6B:
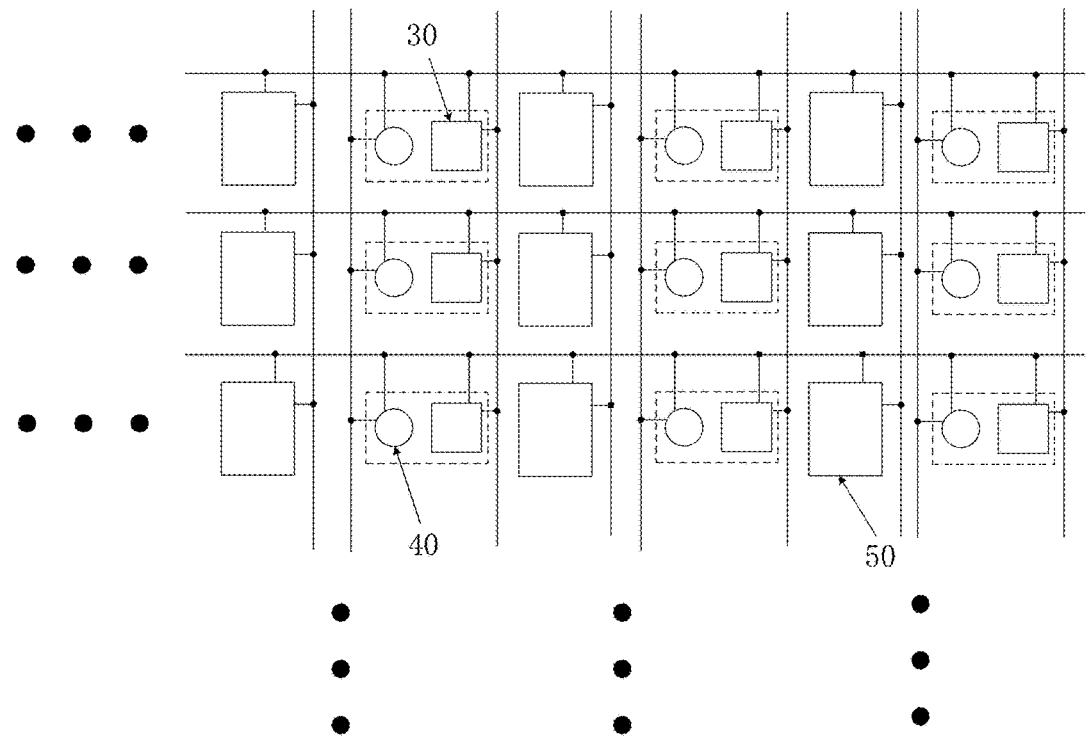

For example, as illustrated in FIG. 6B, one pixel unit 50 in the display device 20 may also be taken as a group, that is, each pixel unit 50 corresponds to one light source 40 and one image sensor 30. For example, the plurality of light sources 40 are arranged in an array in the display device 20, the plurality of image sensors 30 are arranged in an array in the display device 20, and the light sources 40 and the image sensors 30 are disposed within a spacing between two adjacent pixel units 50. For example, the image sensor 30 and the light source 40 corresponding to each pixel unit 50 are adjacent to each other, and are disposed within a spacing between the pixel unit 50 and an adjacent pixel unit in the same column or in the same row. For example, as illustrated in FIG. 6B, the image sensor 30 and the light source 40 may be disposed in a spacing between pixel units 50 of two adjacent columns. It should be noted that the image sensor 30 and the light source 40 may also be correspondingly disposed in a spacing between pixel units 50 of two adjacent rows, or may be disposed in the spacing between pixel units 50 of two adjacent rows and the spacing between pixel units 50 of two adjacent columns, respectively, and the embodiments of the present disclosure are not limited in this aspect.

The specific structure of the display device 20 is described below by taking that the image sensor 30 and the light source 40 are disposed in the spacing between pixel units 50 of two adjacent columns as an example.

Figure 7:
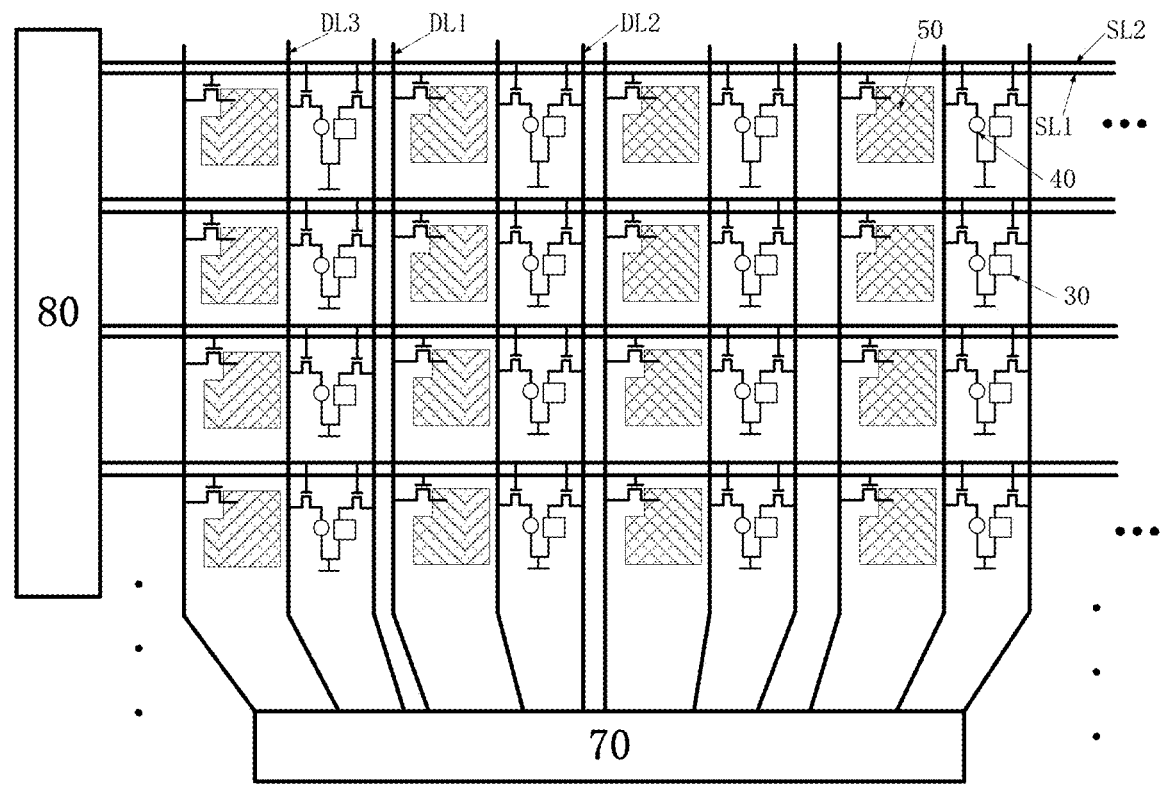
FIG. 7 is a structural perspective diagram of a specific example corresponding to the display device illustrated in FIG. 6B.

FIG. 7 is a structural perspective diagram of a specific example corresponding to the display device 20 illustrated in FIG. 6B. For example, as illustrated in FIG. 7, the display device 20 includes a plurality of pixel units 50 arranged in an array, each pixel unit 50 corresponds to one image sensor 30 and one light source 40, and the image sensor 30 and the light source 40 may be disposed in the spacing between pixel units 50 of two adjacent columns. For example, each column of pixel units 50 is electrically connected to a power management circuit 70 located in a bonding region through a first voltage line DL1 to obtain a corresponding first driving voltage, and each row of pixel units 50 is electrically connected to a gate driving circuit 80 through a first scanning line SL1 to obtain a corresponding first scanning signal and start working in response to the corresponding first scanning signal. For example, each column of image sensors 30 is electrically connected to the power management circuit 70 through a second voltage line DL2 to obtain a corresponding second driving voltage, and each column of light sources 40 is electrically connected to the power management circuit 70 through a third voltage line DL3 to obtain a corresponding third driving voltage. For example, the power management circuit 70 may be a data driving circuit or a driving circuit provided additionally. For example, each row of image sensors 30 and each row of light sources 40 are electrically connected to the gate driving circuit 80 through a second scanning line SL2 to start working in response to a corresponding second scanning signal. It should be noted that according to practical requirements, the image sensors 30 and the light sources 40 in the same row may also be electrically connected to different scanning lines to respond to different scanning signals, respectively, which are not limited in the embodiments of the present disclosure.

For example, all the image sensors 30 and all the light sources 40 in the display device 20 can be simultaneously turned on by controlling second scanning signals provided by the plurality of second scanning lines SL2, so that image signals comprising depth image information of all the partial regions of the detection object 10 can be quickly acquired, thereby effectively reducing the time required to completely acquire the depth image information of the detection object 10 and improving the detection efficiency of the display device 20 while implementing high-precision spatial interaction. For example, the image sensors 30 and the light sources 40 in the display device 20 may be turned on, region by region and period by period, by controlling the second scanning signals provided by the plurality of second scanning lines SL2, thereby reducing the required power consumption for the display device 20 to complete depth image information acquisition once.

Figure 8:
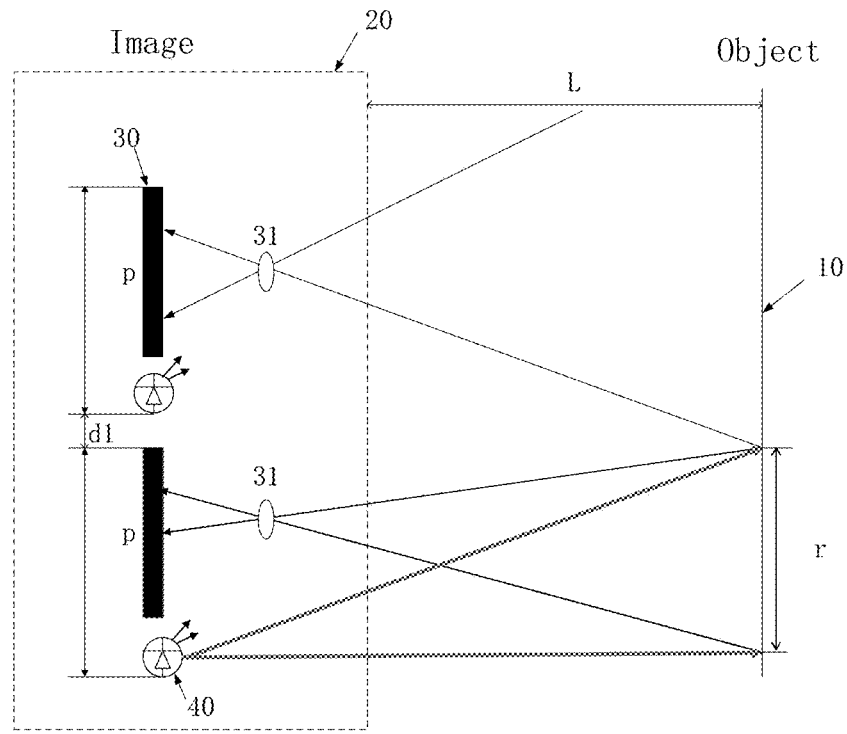
FIG. 8 is an equivalent schematic diagram of space positioning of a display device provided by some embodiments of the present disclosure.

For example, by taking the situation illustrated in FIG. 6B as an example, FIG. 8 is an equivalent schematic diagram of spatial positioning of a display device 20 provided by some embodiments of the present disclosure.

As illustrated in FIG. 8, each image sensor 30 and each light source 40 are disposed at a distance d1 therebetween. For example, the light emitted by the light source 40 can be irradiated to a partial region r of the detection object 10, and a small opening 31 is provided corresponding to the image sensor 30, so as to allow the light reflected by the detection object 10 to be irradiated to the corresponding image sensor 30 to form an image through the small opening 31, so that the image sensor 30 may obtain image information representing the partial region r of the detection object 10. For example, the corresponding small opening 31 may be provided on the base substrate of the display device 20, or both the backlight module and the base substrate are provided with corresponding small openings 31 in the case where the display device 20 includes the backlight module, so that the reflected light can be irradiated to the image sensor 30.

For example, because each image sensor 30 and each light source 40 correspond to one pixel unit 50, each image sensor 30 only receives the light reflected by one single pixel point and obtains depth image information of a single pixel size p. As illustrated in FIG. 8, the distance d1 between the image sensor 30 and the light source 40 can be set to be very small, so that the display device 20 can cover a large distance range L when acquiring depth image information. That is, the display device 20 can obtain both the depth image information of the detection object 10 at a long distance and the depth image information of the detection object 10 at a short distance, so that both the spatial interaction with the detection object 10 at the long distance and the spatial interaction with the detection object 10 at the short distance can be implemented.

Figure 9:
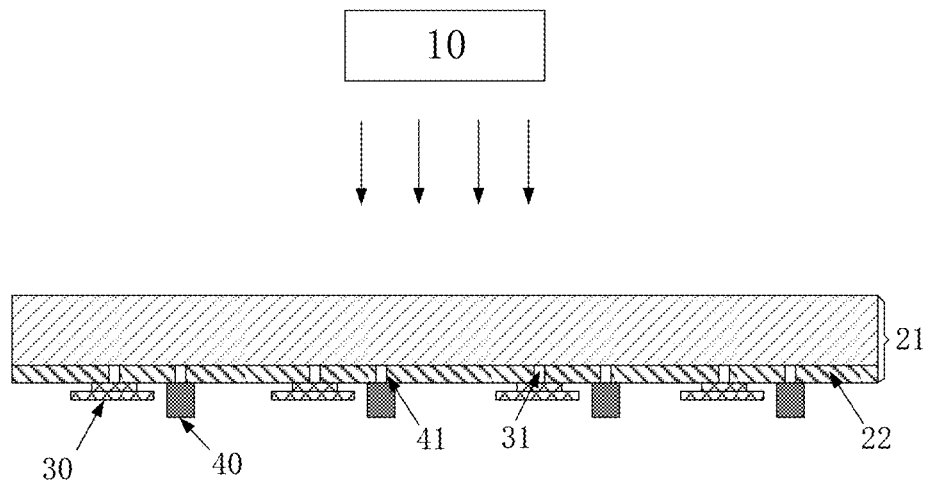
FIG. 9 is a schematic structural diagram of a display device provided by some embodiments of the present disclosure.
Figure 10:
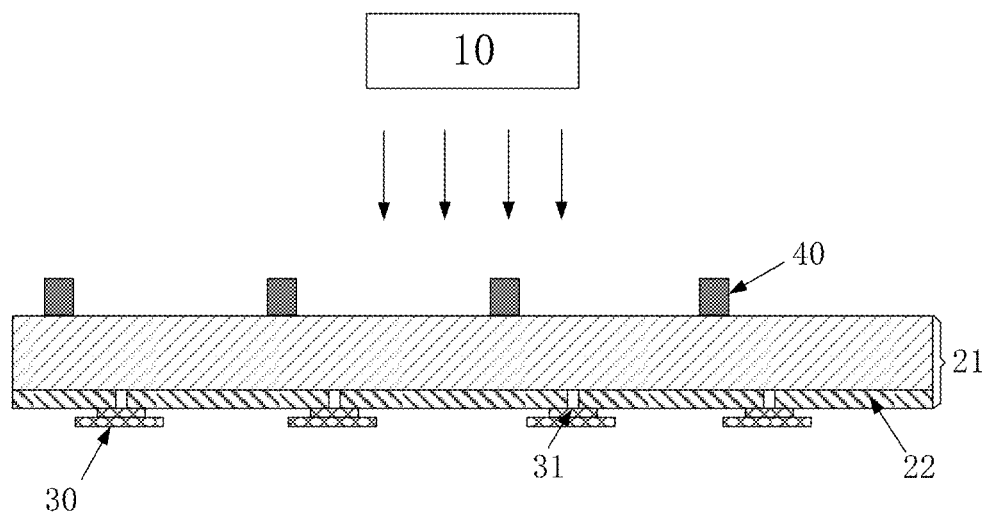
FIG. 10 is a schematic structural diagram of another display device provided by some embodiments of the present disclosure.
Figure 11:
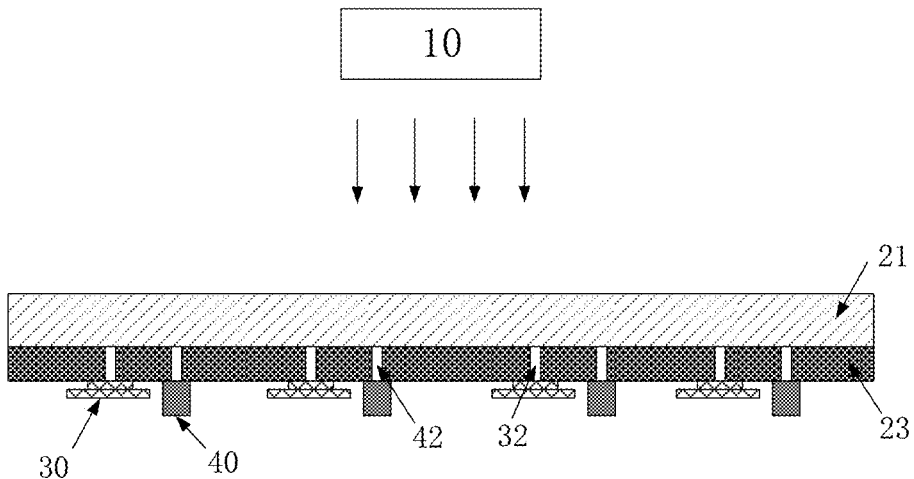
FIG. 11 is a schematic structural diagram of still another display device provided by some embodiments of the present disclosure.
Figure 12:
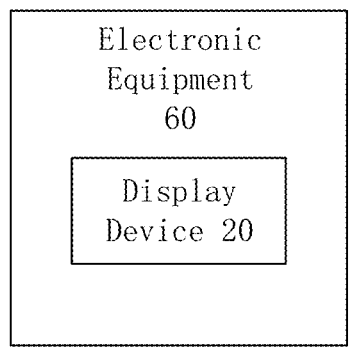
FIG. 12 is a schematic block diagram of an electronic equipment provided by some embodiments of the present disclosure.

FIG. 9 to FIG. 11 are schematic structural diagrams of the display device 20 provided by some embodiments of the present disclosure.

For example, as illustrated in FIG. 9, a display panel 21 of the display device 20 further includes a first substrate 22, and the first substrate 22 is located on a side, away from the display side of the display device 20, of the display panel 21, that is, located on the back side of the display device 20. The plurality of image sensors 30 may be provided at a plurality of independent positions on a surface, away from the display side of the display device 20, of the first substrate 22, and the first substrate 22 is provided with a plurality of first openings 31 corresponding to the plurality of image sensors 30 in a direction perpendicular to the surface of the first substrate 22.

For example, as illustrated in FIG. 9, the plurality of light sources 40 may be provided at a plurality of independent positions on a surface, away from the display side of the display device 20, of the first substrate 22, and the first substrate 22 is provided with a plurality of second openings 41 corresponding to the plurality of light sources 40 in the direction perpendicular to the surface of the first substrate 22. Alternatively, for example, as illustrated in FIG. 10, the plurality of light sources 40 may also be provided at a plurality of independent positions on the display side of the display device 20, so that the light emitted by the light sources 40 can be directly irradiated to the detection object 10, thereby further reducing the optical loss and greatly lowering the power consumption requirements of the light sources 40.

For example, corresponding to the display device 20 illustrated in FIG. 7, the plurality of image sensors 30 and the plurality of light sources 40 may be provided at the plurality of independent positions on the surface, away from the display side of the display device 20, of the first substrate 22 as illustrated in FIG. 9, and the first substrate 22 is provided with the plurality of first openings 31 corresponding to the plurality of image sensors 30 and the plurality of second openings 41 corresponding to the plurality of light sources 40 in the direction perpendicular to the surface of the first substrate 22.

For example, the display panel 21 may be a transparent display panel that at least partially allows the light emitted by the light source 40 to pass through, and the transparent display panel includes, for example, a light transmitting structure that allows light emitted from the display side of the display device 20 or light emitted toward the display side of the display device 20 to pass through, such as a transparent portion. For example, gap portions between the pixel units 50 of the display panel 21 may be prepared to be transparent, and the embodiments of the present disclosure do not limit the manner of implementing the transparent display panel.

For example, as illustrated in FIG. 11, in the case where the display device 20 is a liquid crystal display device and includes a backlight module 23, the backlight module 23 is located on a side, away from the display side of the display device 20, of the display panel 21, and is configured to provide display light for the display panel 21. The plurality of image sensors 30 and the plurality of light sources 40 may be respectively disposed at a plurality of independent positions on a surface (that is, a side away from the display side of the display device 20), away from the display side of the display device 20, of a back plate of the backlight module 23 of the display device 20, and the back plate of the backlight module 23 is provided with a plurality of third openings 32 corresponding to the plurality of image sensors 30 and a plurality of fourth openings 42 corresponding to the plurality of light sources 40 in a direction perpendicular to a surface of the back plate of the backlight module 23.

It should be noted that the display panel 21 of the display device 20 illustrated in FIG. 11 may also include the first substrate 22 (not illustrated in the figure). In the case where the display panel 21 includes the first substrate 22, the first substrate 22 may also be provided with the plurality of first openings 31 and the plurality of second openings 41 described above, and the plurality of second openings 41 provided on the first substrate 22 are in one-to-one correspondence with the plurality of fourth openings 42 provided on the backlight module 23, so as to allow the light of the determined frequency emitted by the corresponding light source 40 to be irradiated to the detection object 10 through the second opening 41 and the fourth opening 42. The plurality of first openings 31 provided on the first substrate 22 are in one-to-one correspondence with the plurality of third openings 32 provided on the backlight module 23, so as to allow the corresponding image sensor 30 to receive the light of the determined frequency reflected by the detected object 10 through the first opening 31 and the third opening 32. Alternatively, the plurality of light sources 40 may also be disposed at a plurality of independent positions on the display side of the display device 20 to lower the power consumption requirements of the light sources 40, and the embodiments of the present disclosure are not limited in this aspect.

For example, the display panel 21 illustrated in FIG. 9 may be an organic light-emitting diode (OLED) display panel, and the display panel 21 illustrated in FIG. 11 may be a liquid crystal display (LCD) panel.

It should be noted that, in the embodiments of the present disclosure, the positions of the image sensors 30 and the light sources 40 are not limited to the above. The image sensors 30 and the light sources 40 may be located at any applicable positions of the display device 20, and the embodiments of the present disclosure are not limited in this aspect.

For example, in the display device 20 provided by at least one embodiment of the present disclosure, the light emitted by the light source 40 includes infrared light, and may be infrared light in various spectrum ranges, such as near-infrared light, mid-infrared light, or far-infrared light. Because the infrared light cannot be seen by human eyes and may not harm human eyes, the use of infrared light may not affect the display quality and user experience of the display device 20. The light source 40 includes an infrared light source, for example, an infrared light-emitting diode (LED), an infrared laser diode, or other applicable light sources. For example, in the case where the infrared laser diode is not used, an optical component (such as a collimating lens, a converging lens, etc.) may be used to allow the obtained infrared light beam to have better directivity, and the embodiments of the present disclosure are not limited in this aspect. For example, the light source 40 includes a point light source or a surface light source.

For example, in some embodiments of the present disclosure, the display device 20 may be a transparent display device that at least partially allows the light emitted by the light source to pass through, such as an organic light-emitting diode (OLED) display device, a quantum dot light-emitting diode (QLED) display device, a micro light-emitting diode display device, a liquid crystal display (LCD) device, or a display device of other types. In order to implement transparent display, the display device 20 includes, for example, a structure that allows the light emitted from the display side and towards to the display device 20 to pass through, such as a transparent portion. For example, gap portions between display pixels of the OLED display device may be prepared to be transparent; and for example, the LCD display device is of a normally white type, and the display pixels are transparent where no driving voltage is applied. The embodiments of the present disclosure do not limit the manner of implementing the transparent display device.

It should be noted that, because the light emitted by the display device 20 during display is visible light, and the light used by the display device 20 for acquiring depth image information is infrared light, the visible light and the infrared light do not interfere with each other. Therefore, in the case where the display device 20 is, for example, an OLED display device, the depth image information acquiring operation and the display operation of the display device 20 can be performed simultaneously, and the use of light with different wavelengths can further avoid interference between the display operation and the depth image information acquiring operation. In the case where the display device 20 is, for example, an LCD display device, the light emitted by the light source 40 and the reflected light received by the image sensor 30 need to pass through, for example, a liquid crystal layer, so when the LCD display device performs the depth image information acquiring operation, the rotation angle of liquid crystal molecules in the liquid crystal layer needs to be controlled (for example, the LCD display device is set to be a normally white type) to avoid the transmission of the light wave signal from being affected, and therefore, the depth image information acquiring operation and the display operation need to be performed in a time-sharing manner.

For example, the image sensor 30 may be an image sensor of suitable type, such as an image sensor of CMOS type or charge-coupled device (CCD) type. For example, the image sensor 30 may be a silicon-based image sensor, and the manufacturing method may include preparing and cutting a monocrystalline silicon wafer. For example, the image sensor 30 may also be an infrared image sensor or a narrow-band infrared image sensor equipped with an infrared wavelength filter.

For example, in some embodiments of the present disclosure, the image sensor 30 and the light source 40 may be integrated with the display device 20 by using micro-transfer-printing (pTP), surface mount technology (SMT), or the like. The integration may also be obtained by other applicable processes, and the embodiments of the present disclosure are not limited in this aspect.

For example, the light-emitting control unit 300, the image signal processing unit 400, the depth image information merging unit 500, and a plurality of units or modules included therein may include a processor that implements functions such as signal control, image analysis, and merging by combining corresponding computer instructions with the processing unit having data processing capabilities and/or instruction execution capabilities. For example, the light-emitting control unit 300, the image signal processing unit 400, and the depth image information merging unit 500 may be a general-purpose processor, such as a central processing unit (CPU) or a graphics processing unit (GPU), and implement corresponding functions by executing computer instructions, and these computer instructions are computer software in logic and form. For example, the light-emitting control unit 300, the image signal processing unit 400, and the depth image information merging unit 500 may also be a dedicated processor that implements corresponding functions through firmware or solidified instructions, such as a field programmable gate array (FPGA), an application specific integrated circuit (ASIC), a digital signal processor (DSP), etc.

For example, the demodulation unit 411, the de-spreading unit 412, the synchronization detecting unit 413, the current-to-voltage conversion unit 414, the filter amplification unit 415, the low-pass filter unit 416, and the analog-to-digital conversion unit 417 may be implemented in various applicable manners. For example, the above units may be composed of components such as transistors, resistors, capacitors, amplifiers, and the like. For example, the demodulation unit 411 may include a demodulation circuit, the de-spreading unit 412 may include a de-spreading circuit, the synchronization detecting unit 413 may include a synchronization detecting circuit, the current-to-voltage conversion unit 414 may include a current-to-voltage conversion circuit, the filter amplification unit 415 may include a filter amplification circuit, the low-pass filter unit 416 may include a low-pass filter circuit, the analog-to-digital conversion unit 417 may include an analog-to-digital conversion (ADC) circuit, and the like. For example, the above units may also be implemented by a signal processor such as the FPGA, DSP, MCU, or may further include a processor and a memory, where the processor executes the software program stored in the memory to implement the corresponding functions. The embodiments of the present disclosure are not limited in this aspect.

For example, in some embodiments of the present disclosure, the detection object 10 may be a user's hand, or other body parts of the user, or may be a wearable device or other types of objects to be detected, and the embodiments of the present disclosure are not limited in this aspect.

At least one embodiment of the present disclosure further provides a method for driving a display device, and the method includes: driving a first light source group to emit light of a first determined frequency to a display side of the display device to illuminate a first partial region of a detection object, driving a second light source group to emit light of a second determined frequency to the display side of the display device to illuminate a second partial region of the detection object, and the first determined frequency being different from the second determined frequency; and driving a first image sensor group to receive the light of the first determined frequency emitted by the first light source group and reflected by the detection object, so as to obtain a first image signal comprising depth image information of the first partial region of the detection object, and driving a second image sensor group to receive the light of the second determined frequency emitted by the second light source group and reflected by the detection object, so as to obtain a second image signal comprising depth image information of the second partial region of the detection object.

For example, the method for driving the display device provided by at least one embodiment of the present disclosure further includes: allowing a first light-emitting control unit to generate a first driving signal to drive the first light source group to emit the light of the first determined frequency, and allowing a second light-emitting control unit to generate a second driving signal to drive the second light source group to emit the light of the second determined frequency. The first driving signal is different from the second driving signal.

For example, in the method for driving the display device provided by at least one embodiment of the present disclosure, allowing the first light-emitting control unit to generate the first driving signal to drive the first light source group to emit the light of the first determined frequency and allowing the second light-emitting control unit to generate the second driving signal to drive the second light source group to emit the light of the second determined frequency includes: allowing the first light-emitting control unit to generate the first driving signal according to a pseudo random code sequence of a pseudo-synchronous sequence unit of the first light-emitting control unit, and a spread-spectrum code sequence and a modulation signal of a spread-spectrum modulation unit of the first light-emitting control unit; and allowing the second light-emitting control unit to generate the second driving signal according to a pseudo random code sequence of a pseudo-synchronous sequence unit of the second light-emitting control unit, and a spread-spectrum code sequence and a modulation signal of a spread-spectrum modulation unit of the second light-emitting control unit.

For example, the method for driving the display device provided by at least one embodiment of the present disclosure further includes: processing the first image signal obtained by the first image sensor group according to the first driving signal generated by the first light-emitting control unit, and processing the second image signal obtained by the second image sensor group according to the second driving signal generated by the second light-emitting control unit.

For example, the method for driving the display device provided by at least one embodiment of the present disclosure further includes: merging the depth image information of the first partial region of the detection object obtained through the first image sensor group with the depth image information of the second partial region of the detection object obtained through the second image sensor group.

For example, the method for driving the display device provided by at least one embodiment of the present disclosure further includes: driving the display device to perform a display operation.

The method for driving the display device provided by other embodiments of the present disclosure may include more or fewer steps, and the sequence of the steps is not limited and may be determined according to practical requirements. The details and technical effects of the method can be with reference to the description of the display device 20 above, and details are not described herein again.

At least one embodiment of the present disclosure further provides an electronic equipment, and the electronic equipment includes the display device according to any one of the embodiments of the present disclosure. FIG. 11 is a schematic block diagram of an electronic equipment 60 provided by some embodiments of the present disclosure. As illustrated in FIG. 11, the electronic equipment 60 may include, for example, the display device 20. The technical effects and implementation principles of the electronic equipment 60 are basically the same as those of the display device 20 described in the embodiments of the present disclosure, and details are not described herein again. For example, the electronic equipment 60 may be any product or component having a display function, such as a liquid crystal panel, an electronic paper, an OLED panel, a mobile phone, a tablet computer, a television, a display, a notebook computer, a digital photo frame, a navigator, etc., and the embodiments of the present disclosure are not limited in this aspect.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. However, it should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display device, comprising a plurality of light source groups and a plurality of image sensor groups, wherein the plurality of light source groups comprise a first light source group and a second light source group, and the plurality of image sensor groups comprise a first image sensor group and a second image sensor group;

the first image sensor group corresponds to the first light source group, and the second image sensor group corresponds to the second light source group;

the first light source group is configured to emit light of a first determined frequency to a display side of the display device to illuminate a first partial region of a detection object, the second light source group is configured to emit light of a second determined frequency to the display side of the display device to illuminate a second partial region of the detection object, and the first determined frequency is different from the second determined frequency; and the first image sensor group is configured to receive the light of the first determined frequency emitted by the first light source group and reflected by the detection object, and the second image sensor group is configured to receive the light of the second determined frequency emitted by the second light source group and reflected by the detection object, wherein the first light source group is separated from the second light source group, the first image sensor group is separated from the second image sensor group, the first light source group is adjacent to the first image sensor group, and the second light source group is adjacent to the second image sensor group.

2. A display device, comprising a plurality of light source groups and a plurality of image sensor groups,
wherein the plurality of light source groups comprise a first light source group and a second light source group, and the plurality of image sensor groups comprise a first image sensor group and a second image sensor group;
the first image sensor group corresponds to the first light source group, and the second image sensor group corresponds to the second light source group;
the first light source group is configured to emit light of a first determined frequency to a display side of the display device to illuminate a first partial region of a detection object, the second light source group is configured to emit light of a second determined frequency to the display side of the display device to illuminate a second partial region of the detection object, and the first determined frequency is different from the second determined frequency;
the first image sensor group is configured to receive the light of the first determined frequency emitted by the first light source group and reflected by the detection object, and the second image sensor group is configured to receive the light of the second determined frequency emitted by the second light source group and reflected by the detection object;
the display device further comprises a plurality of light-emitting control circuits, wherein the plurality of light-emitting control circuits comprise a first light-emitting control circuit and a second light-emitting control circuit;
the first light-emitting control circuit is in signal connection with the first light source group, and the first light-emitting control circuit is configured to provide a first driving signal to allow the first light source group to emit the light of the first determined frequency; and
the second light-emitting control circuit is in signal connection with the second light source group, the second light-emitting control circuit is configured to provide a second driving signal to allow the second light source group to emit the light of the second determined frequency, and the first driving signal is different from the second driving signal.

3. The display device according to claim 2, further comprising a display panel,
wherein the display panel comprises a plurality of pixel units arranged in an array;
each of the plurality of light source groups comprises one light source, and each of the plurality of image sensor groups comprises one image sensor; and
each of the pixel units corresponds to one light source and one image sensor, and the light source and the image sensor are within a spacing between two adjacent pixel units.

4. The display device according to claim 3, wherein the display panel comprises a first substrate away from the display side,
a plurality of image sensors and a plurality of light sources are at a plurality of independent positions on a surface, away from the display side, of the first substrate, respectively, and the first substrate is provided with a plurality of first openings corresponding to the plurality of image sensors and a plurality of second openings corresponding to the plurality of light sources in a direction perpendicular to the surface of the first substrate.

5. The display device according to claim 4, wherein the display panel is an organic light-emitting diode display panel.

6. The display device according to claim 3, further comprising a backlight module,
wherein the backlight module is on a side, away from the display side, of the display panel,
a plurality of image sensors and a plurality of light sources are at a plurality of independent positions on a surface, away from the display side, of a back plate of the backlight module, respectively, and the back plate is provided with a plurality of third openings corresponding to the plurality of image sensors and a plurality of fourth openings corresponding to the plurality of light sources in a direction perpendicular to the surface of the backlight module.

7. The display device according to claim 6, wherein the display panel comprises a liquid crystal display panel.

8. The display device according to claim 3, wherein the light source comprises an infrared light source, and the image sensor comprises an infrared image sensor.

9. The display device according to claim 2, further comprising a display panel,
wherein the display panel comprises a plurality of pixel units arranged in an array, the plurality of pixel units are divided into a plurality of pixel unit groups, and each pixel unit group corresponds to one light source group and one image sensor group.

10. The display device according to claim 2, wherein the display device comprises a display region and a non-display region outside the display region, light sources in the plurality of light source groups and image sensors in the plurality of image sensor groups are distributed in the non-display region of the display device, and
the light sources and the image sensors are at a plurality of independent positions on the display side of the display device and/or on a back side, opposite to the display side, of the display device.

11. The display device according to claim 2, wherein each of the plurality of light-emitting control circuits comprises a pseudo-synchronous sequence sub-circuit and a spread-spectrum modulation sub-circuit;
the pseudo-synchronous sequence sub-circuit is configured to provide a pseudo random code sequence, and the spread-spectrum modulation sub-circuit is configured to provide a spread-spectrum code sequence and a modulation signal;
the first light-emitting control circuit is configured to generate the first driving signal according to a pseudo random code sequence of a pseudo-synchronous sequence sub-circuit of the first light-emitting control circuit, and according to a spread-spectrum code sequence and a modulation signal of a spread-spectrum modulation sub-circuit of the first light-emitting control circuit; and
the second light-emitting control circuit is configured to generate the second driving signal according to a pseudo random code sequence of a pseudo-synchronous sequence sub-circuit of the second light-emitting control circuit, and according to a spread-spectrum code sequence and a modulation signal of a spread-spectrum modulation sub-circuit of the second light-emitting control circuit.

12. The display device according to claim 11, wherein the pseudo random code sequence provided by the pseudo-synchronous sequence sub-circuit of the first light-emitting control circuit for the first light source group is different from the pseudo random code sequence provided by the pseudo-synchronous sequence sub-circuit of the second light-emitting control circuit for the second light source group; and/or
the spread-spectrum code sequence provided by the spread-spectrum modulation sub-circuit of the first light-emitting control circuit for the first light source group is different from the spread-spectrum code sequence provided by the spread-spectrum modulation sub-circuit of the second light-emitting control circuit for the second light source group; and/or
the modulation signal provided by the spread-spectrum modulation sub-circuit of the first light-emitting control circuit for the first light source group is different from the modulation signal provided by the spread-spectrum modulation sub-circuit of the second light-emitting control circuit for the second light source group.

13. The display device according to claim 11, further comprising a plurality of image signal processing circuits,
wherein the plurality of image signal processing circuits comprise a first image signal processing circuit and a second image signal processing circuit;
the first image signal processing circuit is in signal connection with the first image sensor group, and the first image signal processing circuit is configured to process a first image signal obtained by the first image sensor group according to the first driving signal provided by the first light-emitting control circuit, so as to obtain depth image information of the first partial region of the detection object; and
the second image signal processing circuit is in signal connection with the second image sensor group, and the second image signal processing circuit is configured to process a second image signal obtained by the second image sensor group according to the second driving signal provided by the second light-emitting control circuit, so as to obtain depth image information of the second partial region of the detection object.

14. The display device according to claim 13, wherein each of the plurality of image signal processing circuits comprises a demodulation sub-circuit, a de-spreading sub-circuit, and a synchronization detecting sub-circuit;
a demodulation sub-circuit of the first image signal processing circuit is configured to demodulate the first image signal obtained by the first image sensor group according to the modulation signal of the first light-emitting control circuit, and a demodulation sub-circuit of the second image signal processing circuit is configured to demodulate the second image signal obtained by the second image sensor group according to the modulation signal of the second light-emitting control circuit;
a synchronization detecting sub-circuit of the first image signal processing circuit is configured to perform pseudo-code synchronization detecting calculation on the first image signal obtained by the first image sensor group according to the pseudo random code sequence of the first light-emitting control circuit, and a synchronization detecting sub-circuit of the second image signal processing circuit is configured to perform pseudo-code synchronization detecting calculation on the second image signal obtained by the second image sensor group according to the pseudo random code sequence of the second light-emitting control circuit; and
a de-spreading sub-circuit of the first image signal processing circuit is configured to de-spread the first image signal obtained by the first image sensor group according to the spread-spectrum code sequence of the first light-emitting control circuit, and a de-spreading sub-circuit of the second image signal processing circuit is configured to de-spread the second image signal obtained by the second image sensor group according to the spread-spectrum code sequence of the second light-emitting control circuit.

15. The display device according to claim 13, further comprising a depth image information merging circuit,
wherein the depth image information merging circuit is configured to merge the depth image information of the first partial region of the detection object obtained through the first image sensor group with the depth image information of the second partial region of the detection object obtained through the second image sensor group, so as to obtain entire depth image information of the detection object.

16. The display device according to claim 2, wherein the plurality of light source groups further comprise a third light source group, and the plurality of image sensor groups further comprise a third image sensor group;
the third image sensor group corresponds to the third light source group, and the third light source group is adjacent to the third image sensor group;
the first light source group, the second light source group, and the third light source group are separated from each other, and the first image sensor group, the second image sensor group, and the third image sensor group are separated from each other; and
the third light source group is configured to emit light of a third determined frequency to the display side of the display device to illuminate a third partial region of the detection object, the third image sensor group is configured to receive the light of the third determined frequency emitted by the third light source group and reflected by the detection object, and the third determined frequency is different from the first determined frequency and different from the second determined frequency.

17. An electronic equipment, comprising the display device according to claim 2.

18. The display device according to claim 2, wherein the first light source group is separated from the second light source group, the first image sensor group is separated from the second image sensor group,
the first light source group is adjacent to the first image sensor group, and the second light source group is adjacent to the second image sensor group.

19. A method for driving a display device, comprising:
driving a first light source group to emit light of a first determined frequency to a display side of the display device to illuminate a first partial region of a detection object, and driving a second light source group to emit light of a second determined frequency to the display side of the display device to illuminate a second partial region of the detection object, the first determined frequency being different from the second determined frequency;
driving a first image sensor group to receive the light of the first determined frequency emitted by the first light source group and reflected by the detection object, so as to obtain a first image signal comprising depth image information of the first partial region of the detection object, and driving a second image sensor group to receive the light of the second determined frequency emitted by the second light source group and reflected by the detection object, so as to obtain a second image signal comprising depth image information of the second partial region of the detection object; and allowing a first light-emitting control unit to generate a first driving signal to drive the first light source group to emit the light of the first determined frequency, and allowing a second light-emitting control unit to generate a second driving signal to drive the second light source group to emit the light of the second determined frequency, wherein the first driving signal is different from the second driving signal.

20. The method for driving the display device according to claim 19, further comprising:

merging the depth image information of the first partial region of the detection object obtained through the first image sensor group with the depth image information of the second partial region of the detection object obtained through the second image sensor group.

* * * * *